United States Patent
Jego et al.

(10) Patent No.: US 8,332,716 B2
(45) Date of Patent: Dec. 11, 2012

(54) HIGH RATE TURBO ENCODER AND DECODER FOR PRODUCT CODES

(75) Inventors: Christophe Jego, Brest (FR); Patrick Adde, Brest (FR)

(73) Assignee: Groupe des Ecoles des Telecommunications (Enst Bretagne), Paris (FR)

( * ) Notice: Subject to any disclaimer, the term of this patent is extended or adjusted under 35 U.S.C. 154(b) by 1124 days.

(21) Appl. No.: 11/994,803

(22) PCT Filed: Jul. 5, 2006

(86) PCT No.: PCT/US2006/026479
§ 371 (c)(1),
(2), (4) Date: Jan. 4, 2008

(87) PCT Pub. No.: WO2007/006038
PCT Pub. Date: Jan. 11, 2007

(65) Prior Publication Data
US 2008/0229172 A1  Sep. 18, 2008

(30) Foreign Application Priority Data
Jul. 4, 2005  (FR) .................................... 05 07073

(51) Int. Cl.
*H03M 13/00* (2006.01)

(52) U.S. Cl. ..................................................... 714/755

(58) Field of Classification Search ................... 714/752, 714/755, 780, 781, 786, 794
See application file for complete search history.

(56) References Cited

U.S. PATENT DOCUMENTS

| 6,065,147 | A  | * | 5/2000 | Pyndiah et al. | ............... | 714/755 |
|---|---|---|---|---|---|---|
| 6,292,918 | B1 | * | 9/2001 | Sindhushayana et al. | .... | 714/755 |
| 6,304,995 | B1 | * | 10/2001 | Smith et al. | .................... | 714/786 |
| 6,526,538 | B1 | * | 2/2003 | Hewitt | .......................... | 714/780 |
| 6,678,843 | B2 | * | 1/2004 | Giulietti et al. | ............... | 714/701 |
| 6,715,120 | B1 | * | 3/2004 | Hladik et al. | .................. | 714/755 |
| 6,754,290 | B1 | * | 6/2004 | Halter | .......................... | 375/340 |
| 6,775,800 | B2 | * | 8/2004 | Edmonston et al. | .......... | 714/755 |
| 6,859,906 | B2 | * | 2/2005 | Hammons et al. | ............ | 714/786 |
| 7,219,291 | B2 | * | 5/2007 | Adde et al. | .................... | 714/755 |
| 2003/0048206 | A1 | | 3/2003 | Gatherer et al. | | |
| 2004/0054954 | A1 | | 3/2004 | Adde et al. | | |

OTHER PUBLICATIONS

International Search Report for International Application No. PCT/US2006/026479 completed Nov. 7, 2006.
Written Opinion of the International Searching Authority for International Application No. PCT/US2006/026479.
Cuevas, et al., *New Architecture for High Data Rate Turbo Decoding of Product Codes*; IEEE; 2002; pp. 1363-1367; vol. 1 of 3.

(Continued)

*Primary Examiner* — Ajay Bhatia
*Assistant Examiner* — Daniel McMahon
(74) *Attorney, Agent, or Firm* — Alston & Bird LLP

(57) ABSTRACT

The invention relates to a method of decoding a matrix built from concatenated codes, corresponding to at least two elementary codes, with uniform interleaving, the matrix having n1 lines, n2 columns and n1*n2 symbols, the method comprising processing all the lines- and columns-vectors of the matrix by symbol groups, the processing comprising a first decoding to simultaneously process all the symbols of a group of symbols according to their lines and then a second decoding to simultaneously process all the symbols of said group of symbols according to their columns, the symbol groups being thus successively processed in lines and in columns, or conversely.

34 Claims, 14 Drawing Sheets

OTHER PUBLICATIONS

Lucas, et al., *On Iterative Soft-Decision Decoding of Linear Binary Block Codes and Product Codes*; IEEE; 1998; pp. 276-296; vol. 16, No. 2.

Gaudet, et al., *Programmable Interleaver Design For Analog Iterative Decoders*; IEEE; 2002; pp. 457-464; vol. 49, No. 7.

* cited by examiner

| $D_I1$ | | | | | | | | | | | | | | |
|---|---|---|---|---|---|---|---|---|---|---|---|---|---|---|
| | $D_I2$ | | | | | | | | | | | | | |
| | | $D_I3$ | | | | | | | | | | | | |
| | | | $D_I4$ | | | | | | | | | | | |
| | | | | $D_I5$ | | | | | | | | | | |
| | | | | | $D_I6$ | | | | | | | | | |
| | | | | | | $D_I7$ | | | | | | | | |
| | | | | | | | $D_I8$ | | | | | | | |

FIG. 8B

| $D_C1$ | $D_I1$ | | | | | | | | | | | | | |
|---|---|---|---|---|---|---|---|---|---|---|---|---|---|---|
| | $D_C2$ | $D_I2$ | | | | | | | | | | | | |
| | | $D_C3$ | $D_I3$ | | | | | | | | | | | |
| | | | $D_C4$ | $D_I4$ | | | | | | | | | | |
| | | | | $D_C5$ | $D_I5$ | | | | | | | | | |
| | | | | | $D_C6$ | $D_I6$ | | | | | | | | |
| | | | | | | $D_C7$ | $D_I7$ | | | | | | | |
| $D_I8$ | | | | | | | $D_C8$ | | | | | | | |

FIG. 8C

| ▨ | $D_C2$ | $D_I1$ | | | | | | | | | | | | |
|---|---|---|---|---|---|---|---|---|---|---|---|---|---|---|
| | ▨ | $D_C3$ | $D_I2$ | | | | | | | | | | | |
| | | ▨ | $D_C4$ | $D_I3$ | | | | | | | | | | |
| | | | ▨ | $D_C5$ | $D_I4$ | | | | | | | | | |
| | | | | ▨ | $D_C6$ | $D_I5$ | | | | | | | | |
| | | | | | ▨ | $D_C7$ | $D_I6$ | | | | | | | |
| $D_I7$ | | | | | | ▨ | $D_C8$ | | | | | | | |
| $D_C1$ | $D_I8$ | | | | | ▨ | | | | | | | | |

FIG. 8D

| ▨ | ▨ | $D_C3$ | $D_I1$ | | | | | | | | | | | |
|---|---|---|---|---|---|---|---|---|---|---|---|---|---|---|
| | ▨ | ▨ | $D_C4$ | $D_I2$ | | | | | | | | | |
| | | ▨ | ▨ | $D_C5$ | $D_I3$ | | | | | | | | | |
| | | | ▨ | ▨ | $D_C6$ | $D_I4$ | | | | | | | | |
| | | | | ▨ | ▨ | $D_C7$ | $D_I5$ | | | | | | | |
| $D_I6$ | | | | | ▨ | ▨ | $D_C8$ | | | | | | | |
| $D_C1$ | $D_I7$ | | | | | ▨ | ▨ | | | | | | | |
| ▨ | $D_C2$ | $D_I8$ | | | | | ▨ | | | | | | | |

| $D_I1$ | | | | | | | |
|---|---|---|---|---|---|---|---|
| $D_I2$ | | | | | | | |
| $D_I3$ | | | | | | | |
| $D_I4$ | | | | | | | |
| $D_I5$ | | | | | | | |
| $D_I6$ | | | | | | | |
| $D_I7$ | | | | | | | |
| $D_I8$ | | | | | | | |

FIG. 17B

| $D_C$ | $D_I1$ | | | | | | |
|---|---|---|---|---|---|---|---|
| $D_C$ | $D_I2$ | | | | | | |
| $D_C$ | $D_I3$ | | | | | | |
| $D_C$ | $D_I4$ | | | | | | |
| $D_C$ | $D_I5$ | | | | | | |
| $D_C$ | $D_I6$ | | | | | | |
| $D_C$ | $D_I7$ | | | | | | |
| $D_C$ | $D_I8$ | | | | | | |

FIG. 17C

| | $D_C$ | $D_I1$ | | | | | |
|---|---|---|---|---|---|---|---|
| | $D_C$ | $D_I2$ | | | | | |
| | $D_C$ | $D_I3$ | | | | | |
| | $D_C$ | $D_I4$ | | | | | |
| | $D_C$ | $D_I5$ | | | | | |
| | $D_C$ | $D_I6$ | | | | | |
| | $D_C$ | $D_I7$ | | | | | |
| | $D_C$ | $D_I8$ | | | | | |

FIG. 17D

| | | $D_C$ | $D_I1$ | | | | |
|---|---|---|---|---|---|---|---|
| | | $D_C$ | $D_I2$ | | | | |
| | | $D_C$ | $D_I3$ | | | | |
| | | $D_C$ | $D_I4$ | | | | |
| | | $D_C$ | $D_I5$ | | | | |
| | | $D_C$ | $D_I6$ | | | | |
| | | $D_C$ | $D_I7$ | | | | |
| | | $D_C$ | $D_I8$ | | | | |

FIG. 17E

| | | | $D_C$ | $D_I1$ | | | |
|---|---|---|---|---|---|---|---|
| | | | $D_C$ | $D_I2$ | | | |
| | | | $D_C$ | $D_I3$ | | | |
| | | | $D_C$ | $D_I4$ | | | |
| | | | $D_C$ | $D_I5$ | | | |
| | | | $D_C$ | $D_I6$ | | | |
| | | | $D_C$ | $D_I7$ | | | |
| | | | $D_C$ | $D_I8$ | | | |

FIG. 17F

| | | | | | | $D_C$ | $D_I1$ |
|---|---|---|---|---|---|---|---|
| | | | | | | $D_C$ | $D_I2$ |
| | | | | | | $D_C$ | $D_I3$ |
| | | | | | | $D_C$ | $D_I4$ |
| | | | | | | $D_C$ | $D_I5$ |
| | | | | | | $D_C$ | $D_I6$ |
| | | | | | | $D_C$ | $D_I7$ |
| | | | | | | $D_C$ | $D_I8$ |

FIG. 17G

| | | | | | | | $D_C$ |
|---|---|---|---|---|---|---|---|
| | | | | | | | $D_C$ |
| | | | | | | | $D_C$ |
| | | | | | | | $D_C$ |
| | | | | | | | $D_C$ |
| | | | | | | | $D_C$ |
| | | | | | | | $D_C$ |
| | | | | | | | $D_C$ |

US 8,332,716 B2

HIGH RATE TURBO ENCODER AND DECODER FOR PRODUCT CODES

TECHNICAL FIELD

The field of the invention is that of sending and receiving useful data, and particularly for high and very high data rate transmissions. For example, the invention relates to very high rates architectures (which manage rates of typically above 10 or even 40 Gigabits per second).

Devices enabling sending or receipt can be embedded into a number of digital devices, such as fixed or laptop computers, mobile telephones, intelligent telephones (better known as Smart-phones), fixed base stations, PDAs, Internet access points (Wi-fi, Wi-Max, etc), etc.

The field of the invention is more particularly that of encoding as it is sent useful digital data intended to be transmitted, or broadcast, particularly in the presence of noise of different origin, and decoding the encoded data so transmitted.

The field of the invention may particularly relate to the use of turbo codes, the principle of turbo codes being particularly presented in other document FR-91 05280.

Turbo codes promote increased transmission speeds and improved a quality of service. Furthermore, studies are currently underway to introduce turbo codes into information storage systems such as hard disks or DVDs or into fibre optic transmission systems. In the context of developing towards high-speed, fibre optic transmission is a cutting edge technology promoting the development of the content serving infrastructure.

Moreover, the architectures obtained process very high data rate that may exceed 10 Gbits/s or even 40 Gbits/s with the latency of execution much lower than the architectures proposed hitherto.

The invention relates, more precisely, to a process and an electronic module for encoding a matrix having k1 lines, k2 columns and k1*k2 useful data ordered into line-vectors and column-vectors, so as to construct a matrix that has n1 lines, n2 columns and n1*n2 symbols (n1 and n2 being of course greater than k1 and k2 respectively) from concatenated codes, corresponding to two elementary codes, with uniform interleaving. However this process can also be applied to matrices of size T>2 using T elementary codes with uniform interleaving.

In reception, the invention also relates to a process and electronic module for decoding such a constructed matrix, after transmission in a pre-set medium (or channel) and reception.

PRIOR ART

Such a matrix n1*n2 may be constructed according to turbo code technology, which is presented in particular in the document FR-91 05280, including a series or parallel concatenation of elementary codes and a uniform internal interleaving.

In a particular way, a series or parallel concatenation can be implemented, by constructing a product code matrix n1*n2. The product code idea was introduced by P. Elias in his article <<Error-free encoding>> which was published in the review <<IRE Transaction on Information Theory>> (vol. IT4, pages 29-27) in September 1954.

A product code makes it possible to obtain from two (or more) elementary codes, each having a low minimum Hamming distance $\delta$, a code whose minimum Hamming distance is equal to the product of the Hamming distances of the elementary codes used and the output of which is equal to the product of the elementary outputs.

Thus, with reference to FIG. 1, if we consider two elementary codes $C_1(n_1, k_1, \delta_1)$ and $C_2(n_2, k_2, \delta_2)$, obtained from convolutive elementary codes or codes in linear blocks, the product code is presented in the form of a matrix C with $n_1$ lines and $n_2$ columns where:
  the binary data is represented by a sub-matrix M with $k_1$ lines and $k_2$ columns,
  each of the $k_1$ lines of the sub-matrix M is encoded by the code $C_2$,
  each of the $n_2$ columns of the matrix C is encoded by the code $C_1$.

If the code $C_1$ is linear, the $(n_1-k_1)$ lines constructed by $C_1$ are words of the code $C_2$ and can be decoded as the $k_1$ first lines. A product code therefore has $n_1$ code words of $C_2$ depending on the lines, and $n_2$ code words of $C_1$ depending on the columns.

There is a known technique of constructing product codes by applying in succession to the useful data are words of the initial matrix $k_1*k_2$, the polynomials generating the two codes $C_1$ and $C_2$. The first phase consists in making a encoding by the code $C_2$ of the $k_1$ lines of the data matrix. At the end of this phase, an intermediate matrix k1*n2 is obtained, with a redundancy block $k_1*(n_2-k_2)$. The second phase consists in encoding by the code $C_1$ each of the n2 columns of the intermediate matrix, to obtain the final matrix n1*n2.

This approach requires the use of a memory plan of size $k_1*n_2$ so as to memorise said intermediate matrix, between the line encoding and the column encoding.

This memory plan implies that at least one memory has been provided in the electronic circuit that is bulky in terms of size.

Furthermore, storing the intermediate matrix, then reading this memory in respect of column encoding, involves write and read times which slow down the encoding time.

An improvement at this level would therefore be desirable.

As regards the decoding of a constructed matrix of this kind of size n1*n2, the turbo decoding technique can be used consisting of an iterative decoding of the matrix, each iteration including a first half-iteration corresponding to a decoding of all the lines (or all the columns) then a second half-iteration corresponding to a decoding of all the columns (or all the lines). The decoding algorithms have flexible inputs and outputs (in other words the decoder accepts at input and provides at output non binary elements weighted as a function of their likelihood). In a non-iterative decoding context, the decoding algorithms have hard inputs and outputs (in other words the decoder, implementing the algorithm, act sets binary elements at input and provides them at output).

With reference to FIGS. 2 and 3, to block diagrams showed two examples respectively of half-iteration of turbo decoding with flexible inputs and outputs.

With reference to FIG. 2, $R_k$ corresponds to the information received from the channel, $R'_k$ to the information coming from the previous half-iteration and $R'^+_k$ to the information sent at the next half-iteration. The output of each half-iteration is therefore equal to $R_k$ plus a piece of extrinsic information, $W_k$, then multiplied by an alpha number. This extrinsic information corresponds to the contribution of the decoder 10. It is obtained by difference between the weighted output $F_k$ of the decoder 10 and the weighted input of this same decoder 10.

Subsequently the decoder 10 with weighted inputs and outputs will be considered as a block that has $R_k$ and $R'_k$ (sampled over q bits) as inputs, delivering $R_k$ and $R'^+_k$ (sampled over q bits) at output with a certain latency L (delay necessary for implementing the decoding algorithm).

However, with reference to FIG. 3, $R'_k$ and $R'^+_k$ can be replaced by $W_k$ and $W^+_k$ respectively which then become respectively an input and an output of the half-iteration: $R'_k$ is then variable internally.

A turbo decoder can then be integrated according to two techniques:
the sequential technique;
the modular technique (still known as the "pipeline" technique).

With reference to 1a FIG. 4, is presented the sequential architecture, the circuit including a single elementary decoder 10 and a single memory plane 20, a looping between the output at the input of the circuit allows the successive half-iterations to be implemented.

The memory plane 20 consists of four memory is of size $qn_1n_2$ bits irrespective of the number of iteration is carried out. Two of the four memories operate in read mode, the other two operate in right mode. There is an inversion of the operating modes (read/write) of the memories $R'_k$ between each half-iteration. For the memories $R_k$, the inversion of the operating mode occurs on receipt of a new information matrix.

The main interest of the sequential architecture is the low space requirement of the turbo decoder.

The overall latency introduced by the sequential architecture is at most $2*n_1*n_2$, and is irrespective of the number of iterations, a latency being defined as the number of symbols processed by the turbo decoder before a new symbol present at the circuit input is in its turn fully processed.

The major drawback of sequential architecture is the data-processing rate. Indeed, the rate must take into account the use of a single basic structure or "module" (the elementary decoder 10 and the memory plane 20) for all the half-iterations. The maximum data-processing rate for the turbo decoder is therefore at most equal to the processing rate of an elementary decoder divided by the number of half-iterations. This is why sequential architecture allows a reduced processing rate.

The use of this sequential architecture in a high-speed context is consequently inappropriate.

With reference to FIG. 5, is shown the "pipeline" architecture where the integration of a turbo decoder is based on a cascaded modular architecture, the number of modules being equal to the number of half-iterations to be performed. Each module is substantially identical to said module in accordance with the sequential architecture, namely that it includes an elementary decoder 10-i and a memory plane 20-i (i being between 1 and 2 * it, it being the number of iterations).

Decoding from a pipeline structure consists in decoding with weighted inputs and outputs all the lines or all the columns of a matrix for each of the half-iterations. Thus, for it iterations, the architecture of the turbo decoder contains 2 * it elementary decoders 10-i and 8 * it memories of size $q*n_1*n_2$ bits.

The advantage of the pipeline architecture is the data-processing rate. Indeed, the rate obtained is the processing rate of elementary decoder.

On the other hand, the major drawback of this architecture is that it involves a turbo decoder that is very cumbersome on account of the cascaded structure, the space requirement stemming largely from the memory blocks 20-i required to memorise the matrices $R_k$ (information received from the channel) and $R'_k$ (information coming from the previous half-iteration) so as to reconstruct the matrix after decoding according to the lions or the columns.

This architectural solution is therefore very expensive when the number of iterations increases.

Moreover, the latency is equal to $(n_1*n_2*2it)+it*(L_1+L_2)$ for it iterations, the $n_1n_2$ first symbols corresponding to the filling of a data matrix and the $L_i$ following symbols to the actual decoding of a line ($L_1=xn_2$) or a column ($L_2=xn_1$) of this matrix, the value of x depending on the internal structure of the decoders 10-i used.

The latency is therefore substantial, since it introduces an excessive delay.

The document WO 02/39587 describes a technique that allows the problems of low speed in sequential architectures and the problems of space requirement and latency in pipeline architectures to be reduced.

The solution proposed consists in memorising several data at the same address by using a particular organisation of the memory, and in providing a decoder that is able to process several symbols of one line or of one column simultaneously.

FIG. 6 illustrates this technique, by showing a matrix that includes four symbols (i,j), (i,j+1), (i+1,j) and (i+1,j+1) adjacent to each other (i and j representing nine and column indicators respectively). Said a particular organisation of the memory thereby allows these four symbols to be stored at the address (I,J). The memory contains therefore four times fewer words, but words that are four times larger.

For line decoding, the symbols (i,j), (i,j+1) are then assigned to a first elementary decoder DEC1, and (i+1,j), (i+1j+1) to a second elementary decoder DEC2. For column decoding, (i,j), (i+1,j) are taken for DEC1 and (i,j+1), (i+1,j+1) for DEC2.

Since these elementary decoders are able to process the symbol pairs simultaneously at input (reading the memory plane) and at output (writing the memory plane), the matrix data-processing rate is then four times faster than for the conventional decoder. The material charge of this architectural solution entails the use of two elementary decoders simultaneously processing two symbols of a matrix word in the example considered.

Generally speaking, if a word in the new matrix contains m symbols of a line and l symbols of a column, the time for processing the matrix is m.l times faster with only m elementary decoders for processing the lines during a half-iteration and l elementary decoders for processing the columns during the next half-iteration.

This configuration approximately increases the complexity of the decoders in a ratio of $m^2/2$ (cf. Thesis by J. Cuevas <<Turbo Décodage de Code Produit Haut Débit>> or Fast Rate Product Code Turbo Decoding, a doctoral thesis from the University of South Brittany, Brest, 6 May 2004) relative to conventional decoders, but allows a speed $m^2$ times higher to be obtained.

Furthermore, for an identical size, the memory comprises $m^2$ times a fewer words than the initial matrix. At equivalent technology, its access time will therefore be less.

The invention attempts to improve the position relative to these architectures, by providing another type of decoding and new architectures.

One main objective of the invention is to increase the data-processing rate while reducing the overall latency of the turbo decoding circuit, in particular by perfecting sequential and pipeline architectures.

Another objective is to eliminate the memory planes between half-iterations for pipeline architectures, and for sequential architectures.

Another objective is to provide architectures that allow rates above about 10 Gbits/s.

Another objective is to substantially reduce the material charge of the Mbits/s.

SUMMARY OF THE INVENTION

To these ends, the invention proposes, according to a first aspect, a process for decoding a matrix constructed from concatenated codes, corresponding to at least two elementary codes, with uniform interleaving, is this matrix having n1 lines, n2 columns and n1*n2 symbols, characterised in that it includes processing all the line and column vectors in the matrix by symbol groups, this processing includes a first decoding to process simultaneously all the symbols in a group of symbols along their lines then a second decoding to process simultaneously all the symbols of said group of symbols along heir columns, or conversely, the symbols groups being thereby processed successively in lines and in columns.

Other characteristics of this decoding process are:

the process is implemented such that the first decoding of a group of symbols is implemented simultaneously to the implementation of the second decoding of another group of symbols;

according to a first type of decoding according to the invention, the symbols of each symbol group corresponding to align or to a column of the matrix different from that of the symbols of each of the other symbol groups;

according to a second type of decoding according to the invention, the location of a symbol in each symbol group corresponds to a column and to align which are both different from the column and from the line locating each of the other symbols of the group;

in the particular case where the number of symbols in a group of symbols is identical from one group of symbols to another, the processed symbols of a new group are determined by their respective positions in the matrix, the positions being found from the respective positions of the symbols of the group previously processed which are offset in line or in column by a preset index;

said preset index being able to be a whole number modulo a number of symbols per group;

the matrix is furthermore decoded by successive sub-matrices each constituted by symbols groups, each as sub-matrix having symbols different from those of the other sub-matrices, in particular, if n2=u*n1 (or n1=u*n2), u being an integer greater than or equal to 2, each sub-matrix has a size equal to n1*n1 (or n2*n2);

the number of symbols are processed in each group of symbols is equal to the minimum of n1 and n2, min (n1, n2);

at least some of the data processed is weighted;

according to a first configuration, the process does not include a stage for storing data according to a memory plane between the first decoding and the second decoding;

according to a second configuration, the line decoder assembly and the column decoder assembly are constituted by elementary decoders used successively for line and column decoding, and the process includes a data storage stage between the first decoding and the second decoding;

the process is iterative.

According to a second aspect, the invention proposes a decoding module able to implement said decoding process, including a line decoder assembly able to decode lines of said matrix and the column decoder assembly able to decode the columns of said matrix, characterised in that the line decoder assembly and the column decoder assembly are arranged one with the other so as to implement said processing of all the line and column vectors of the matrix by successive symbols groups said first and second decoding is being provided by the line decoder assembly and the column decoder assembly respectively or in reverse.

Other characteristics of this decoding module are:

the module does not include and memory between the line decoder assembly and the column decoder assembly, apart from any memories possibly integrated with the elementary decoders and/or the decoder assembly;

the line (or column) decoder assembly includes a number n1 (or n2) of elementary decoders in parallel and in that the column (or line) decoder assembly is constituted by a combinatory decoder able to process a number n1 (or n2) of symbols simultaneously;

the line decoder assembly includes a number n of line decoders in parallel which is equal to the number of column decoders in parallel included in the column decoder assembly, this number n being less than or equal to min (n1, n2);

the line decoder assembly and the column decoder assembly each include at least one decoder able to process at least two distinct symbols simultaneously;

the line decoder assembly and the column decoder assembly include line decoders in parallel and column decoders in parallel respectively, and are provided one with the other so that the line decoders are connected electrically to the column decoders according to a dynamic interconnection network;

in this case, the interconnection network may allow the communication profile between the line decoders and the column decoders of the circular permutation type, a circular permutation modifying in a cyclical way the connections between line decoders and column decoders, thus determining the successive processing of the symbols groups in the matrix;

the module may furthermore include a second interconnection network substantially identical to the first interconnection network, this second interconnection network being located at the output (or at the input) of the column decoder assembly or at the input (or at the output) of the line decoder assembly;

the module can furthermore include a memory at the input able to memorise the matrix at least temporarily, the line or column decoder assembly being connected to the memory so as to be powered by the lines or by the columns respectively of the memorised matrix.

According to a third aspect, the invention proposes a modular decoding device including several of said decoding modules mounted in series, he is decoding molecules including two interconnection networks, the dynamic interconnection networks of the different modules being configured in order to implement an iterative decoding of the matrix, each iteration being provided by a module.

According to a fourth aspect, the invention proposes a sequential decoding device including said decoding module, additionally and memory, and an electrical connection between the module output and the module input so as to implement an iterative decoding of the matrix, all the iterations being provided by the module.

According to a fifth aspect, the invention proposes a receive terminal including means for receiving signals carrying useful data and means for processing of these signals, characterised in that said processing means include said decoding module or one of said decoding devices. The terminal can for example be a fixed or laptop computer, a mobile telephone, an intelligent telephone (better known as Smart-phones), a fixed base station, a PDA, an Internet access point (Wi-fi, Wi-Max, etc.), etc.

According to a sixth aspect, the invention proposes a process for encoding and matrix having k1 lines, k2 columns and k1*k2 useful data organised in line vectors and column vectors, including k2 (or k1) elementary encoding is along lines (or along columns respectively), characterised in that it additionally includes a combination encoding able to simultaneously process k2 (or k1 respectively) useful data along the columns (or lines respectively), and in that it includes successively:

a first stage of encoding a column (or line respectively) vector implementing said k2 (or k1) elementary encodings, his second stage of encoding said column (or line respectively) vector implementing said combinatory encoding.

According to a seventh aspect, the invention proposes a module for encoding and matrix having k1 lines, k2 columns and k1*k2 useful data organised in line vectors and column vectors, the module including k2 (or k1) elementary encoders, characterised in that it additionally includes an encoder assembly able to simultaneously process k2 (or k1) useful data and provided with the k2 (or k1) elementary encoders so that the useful data vectors of dimension k2 (or k1) are successively encoded, each vector encoding including a first encoding by the k2 (or k1) elementary encoders then a second encoding by the encoding assembly.

Other characteristics of this encoding module are:

the module does not include an intermediate memory between the k2 (or k1) in decoders and the encoding assembly, apart from any memories that may be integrated in the elementary decoders and/or possibly in the encoding assembly;

the encoding assembly is a so-called "combinatory" encoder which corresponds to a combinatory tree-structure of EXCLUSIVE-OR functions.

According to an eighth aspect, the invention proposes a slender terminal including means of sending signals carrying useful data and means of processing this useful data, characterised in that said processing means include said encoding module. The terminal may for example be a fixed or laptop computer, a mobile telephone, an intelligent telephone (better known as Smart-phones), a fixed base station, a PDA, and Internet access point (Wi-fi, Wi-Max, etc), etc.

BRIEF DESCRIPTION OF THE FIGURES

Other characteristics, purposes and advantages will be described in the following non-restrictive description of the invention, illustrated by the following figures:

FIGS. 7A to 7G represent different stages of a first type of matrix decoding according to the invention for a square matrix.

FIGS. 8A to 8H show different stages of a first type of decoding for a non-square matrix according to the invention.

FIGS. 16A to 16D each show respectively a stage of decoding a square matrix during different iterations, the decoding stages being implemented simultaneously by different modules of a pipeline architecture according to the invention.

FIGS. 17A to 17G show different stages of a second type of matrix decoding according to the invention for a square matrix.

DETAILED DESCRIPTION OF THE INVENTION

A general principle according to the invention lies in encoding or decoding in parallel the line and column vectors of a matrix C, by alternating several times simultaneous processing of lines then simultaneous processing of columns. This technique allows successive groups of matrix symbols to be processed fully and continuously.

The invention proposes in particular architectures that make it possible to implement such encoding and decoding, and particularly line and column encoder (or decoder) assemblies able to simultaneously process matrix data along the lines and the columns respectively.

It will be seen subsequently that this type of encoding and decoding according to the invention may reduce the space requirement of the circuit, and allows substantial gains in speed and flow rate.

The matrix C then constructed after encoding (and other one powering the decoder) is constituted by k1 and k2 vectors of useful data (uniformly interleaved along lines of lengths k2 and along columns of length k1) concatenated, in series or in parallel, with at least two elementary codes, to give in the end a dimension n1*n2. This matrix C may for example be for a product code, like the one shown in FIG. 1 and previously discussed.

A. DECODING

Figure 2:
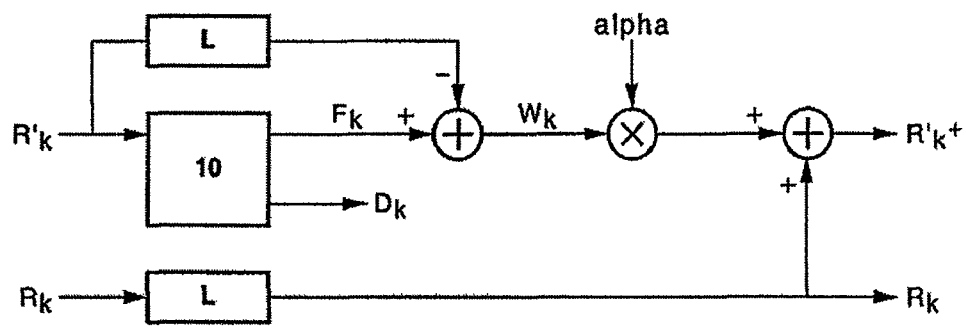
FIGS. 2 and 3 are block diagrams representing two types of turbo decoding with weighted input and output, during a demi iteration.
Figure 3:
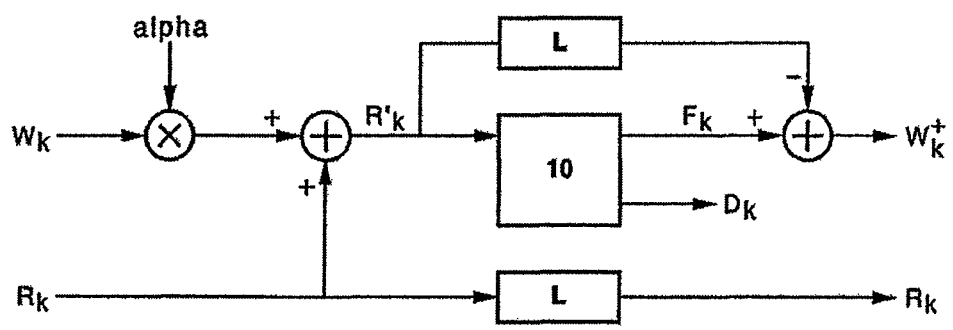
Figure 4:
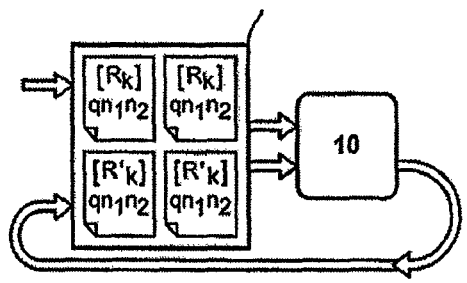
FIG. 4 shows in diagrammatic former a conventional sequential turbo decoder.
Figure 5:
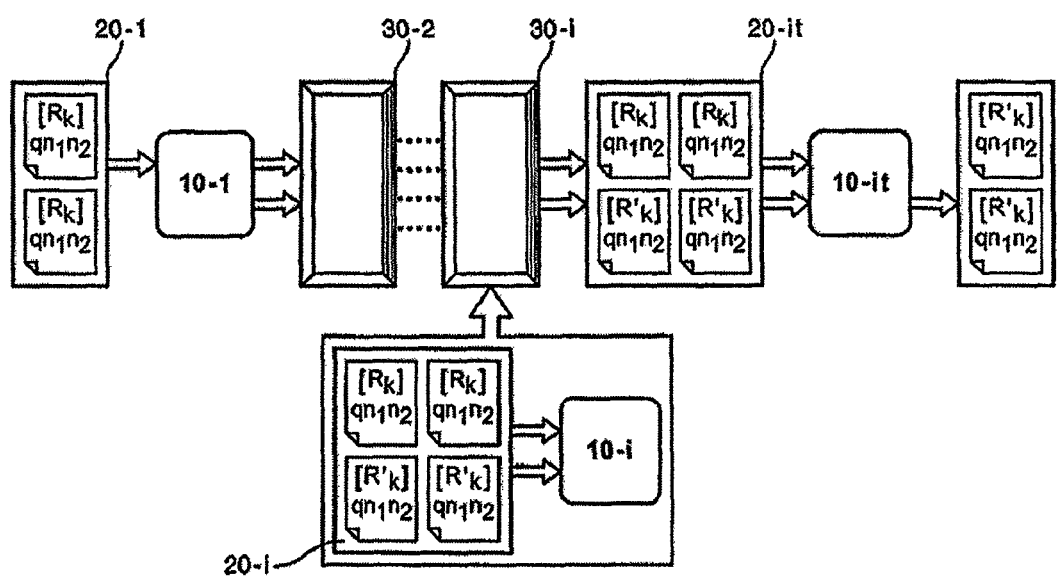
FIG. 5 shows in diagrammatic form a conventional pipeline turbo decoder.

In this part, is presented a type of architecture for turbo decoders of concatenated codes with uniform interleaving, such as product codes. Each of the half-iterations may thus be implemented in accordance with FIG. 2 or 3.

We start from the principle that, for the matrices C constructed from such codes:

the n1 lines and the n2 columns correspond respectively to $n_1$ and $n_2$ independent words; that the $n_1$ words and the n2 words can be decoded respectively in parallel if material resources (elementary decoders) are available; and that the processing of symbols constituting a word has no particular order, the only important thing being the position of the first symbol processed in the word under consideration.

Decoding according to the invention can be implemented by elementary decoders, and/or by combinatory decoders. And elementary decoder is able to process one symbol at a time, whereas a combinatory decoder is able to process several symbols simultaneously.

Examples of elementary and combinatory decoders that can be used in the context of the invention are given in <<Performance and complexity of block turbo decoder circuits>> by P. Adde et al. (ICES '96, p. 172-175). It should be noted that an elementary decoder or a combinatory decoder typically includes a memory, such as a RAM, for storing in a highly provisional way the data which has been just decoded.

I. First Type of Decoding

I.1 Principle of this Decoding

I.1.1. Decoding a Square Matrix

With reference to FIGS. 7A to 7G, different stages in such a processing of a 8*8 square matrix are shown, during a single iteration.

The matrix is shown by a square filled with 8*8 boxes, each box representing a symbol.

For the purposes of decoding, 16 decoders (8 for the lines and 8 for the columns) are provided. A line decoder assembly is here constituted by 8 line decoders ($D_l i$ with i ∈ [1,8]) processing 8 words of 8 symbols. A column decoder assembly is here constituted by 8 column decoders ($D_c j$ with j ∈ [1,8]) also processing 8 words of 8 symbols. Each of these decoders (line or column) is here able to process one symbol at a time: these are therefore elementary decoders, thus able to implement turbo decoding according to FIG. 2 or 3.

Figures 7A, 7B, 7C, 7D, 7E, 7F, 7G:
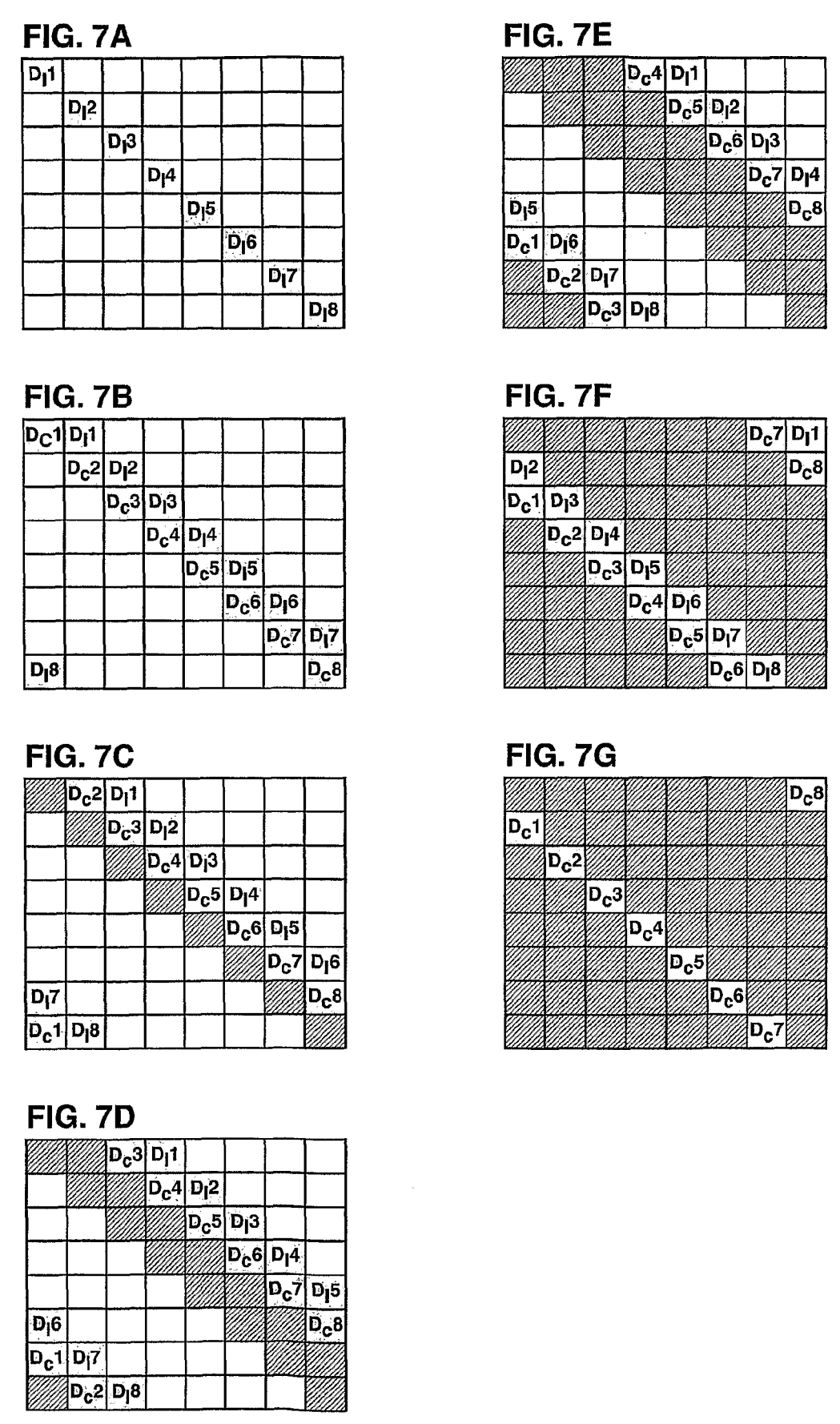

With reference to FIG. 7A, the matrix is here processed starting with a group of symbols constituted by symbols finding themselves on a diagonal, by implementing the line decoders ($D_l i$ with i ∈ [1,8]).

Then, with reference to FIG. 7B, the column decoders ($D_c i$ with i ∈ [1,8]) processed the same at symbols as those processed previously.

Given what has been seen previously (potential processing of symbols independently), the symbols along the diagonal are then fully processed (i.e. in line and in column) during this iteration: this is what is meant by the black boxes in FIG. 7C.

The next group of symbols to be processed is constituted by symbols that have positions found from the respective positions of the group previously processed (here the diagonal): thus, in the present example, the positions of the symbols of the new group of symbols to be processed are found by a setting in line by a unit modulo 8 the positions of the symbols of the diagonal. It will thus be found that the next group of symbols is constituted by the symbols (1,2), (2,3), (3,4), (4,5), (5,6), (6,7), (7,8), (8,1).

In this way, with reference to FIG. 7B, from the point of view of the $2^{nd}$ line word, its symbol (2,3) is processed subsequent to the processing of its symbol (2,2). And from the point of view of the $2^{nd}$ column word, its symbol (1,2) is processed subsequent to the processing of its symbol (2,2). In this way, each line decoder i processes the symbols of a word by implementing the index (i* modulo 8) associated with the symbols. The decoding latency of the matrix C is then L=8*x symbols.

And each column decoder j processes the symbols of a word by decrementing the index (j* modulo 8) associated with the symbols. The decoding latency of the matrix C is then L=8*x symbols. It should be noted that the latency between the decoding of the lines and the decoding of the columns is nil, given that there is a lack of memory plane between the two, these two decoding is succeeding each other with no intermediate memorisation.

The overall latency of the matrix C is then 16*x.

The new group of symbols is then processed identically to the previous one, first of all simultaneously in line (FIG. 7B) then simultaneously in column (FIG. 7C). It is then fully processed during the current iteration (FIG. 7D).

Advantageously, the symbols of a new group are processed in line simultaneously to the processing in column of the previous group (see FIG. 7B): matrix processing time is thus optimised.

The matrix is then fully decoded, during the current iteration, in lines and in columns identically to the $1^{st}$ and $2^{nd}$ symbols groups (see FIGS. 7A to 7G).

In a trivial way, the technical teaching of this example can be applied to the general case of decoding a square matrix, concatenated with uniform interleaving, having a dimension n*n (n lines and n columns).

We thus have 2n decoders, and it is possible to decode n lines and n columns in parallel.

If we consider a complete iteration, the decoding latency of the matrix C following the lines then the columns is then 2L symbols, L=x*n.

It should here be noted that the latency between decoding the lines and decoding the columns is nil, given that there is a lack of memory plane between the two, these two decoding is following each other without intermediate memorisation.

I.1.2 Decoding a Non-Square Matrix

One of the objectives of the parallel decoding of a matrix C is to eliminate the memory planes. This means having as many decoders for the lines as for the columns. If the numbers of lines and columns of a matrix C are different, then 2n decoders can be taken such that n=min($n_1$,$n_2$).

Among them, n decoders are used for decoding the lines and n decoders are used for decoding the columns. Consequently, decoding according to the invention is capable of decoding in parallel n lines and n columns of the matrix C.

With reference to FIGS. 8A to 8H, different stages in processing a 8*16 matrix are shown, during a single iteration.

16 decoders are used (8 for the lines and 8 for the columns). The 8 line decoders ($D_l i$ with i ∈ [1,8]) process 8 words of 16 symbols. The 8 column decoders ($D_c j$ with j ∈ [1,8]) process two times 8 words of 8 symbols.

The matrix is then processed twice, by sub-matrices of 8*8, each sub-matrix being square and processed similarly to the processing of a square matrix as described above. When all the symbols of the first sub-matrix have been processed in lines (in columns), line (column) decoding starts for the second sub-matrix (see FIG. 8F).

In each sub-matrix: for processing along the lines, the index indicating the passage from one symbol to another in a word is incremented by 1 modulo 8 (number of line decoders). Conversely, for processing along the columns, the index indicating the passage from one symbol to the other in a word is decremented by 1 modulo 8 (number of column decoders).

The latency of the line and column decodings are respectively 16x and 8x symbols. Lastly, the latency between decoding the lines and decoding the columns is nil (absence of memory plane).

More generally, if we consider a matrix n1*n2 with n2=u*n1 (or n1=u*n2), with u an integer greater than or equal to 2, the processing is undertaken successively by the sub-matrices (which are here u in number): for processing along the lines, the index indicating a passage from one symbol to another in a word is incremented by 1 modulo n (number of line decoders). Conversely, for processing along the columns, the index indicating the passage from one symbol to another in a word is decremented by 1 modulo n (number of column decoders). The latency of a complete iteration is then (n1+n2)x.

Clearly, the above examples and developments are not restricted to processing along the lines then along the columns, but also extend trivially to processing along the columns then along the lines.

Furthermore, the 1st symbol group processed in the matrix is obviously not necessarily the group constituted by the main diagonal, but can obviously be selected otherwise. It is nonetheless preferred that the location of a symbol in each symbol group corresponds to a column and to a line which are respectively different from the column and the line each locating other symbols of the group. The number of symbols in a symbol group is also preferentially identical from one group of symbols to another, in order to use as many decoders for processing from one group to another group. Lastly, since the processed symbols of a new group are determined by their respective positions in the matrix, these positions are to advantage found from the respective positions of the symbols of the group previously processed by offsetting them in line or in column by a pre-set index. This preset index of setting is not restricted to a value equal to the unit modulo n, but to any means that allows the whole matrix to be scanned without processing the same symbol a second time during one and the same iteration.

Lastly, the number n of decoders used (in line and in column) is not necessarily equal to n1 or to n2. Indeed, it may also be less than n, in a particular case where at least one decoder is used able to decode several symbols simultaneously, such as the decoders disclosed in WO 02/39587 (discussed above).

A technique has been described in this chapter for the parallel decoding of product codes. This technique can be applied to all product code turbo decoder architectures.

I.2 Turbo Decoding

Figure 9:
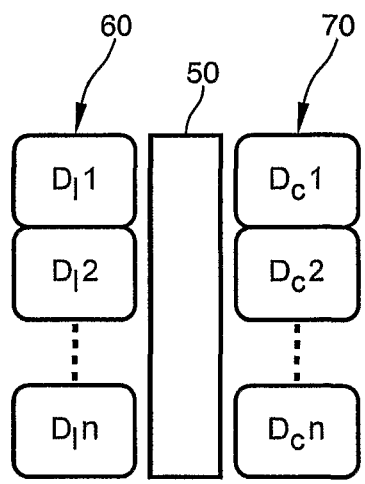
FIG. 9 shows in diagrammatic form a decoding module architecture according to the invention.

One of the advantages of the technique of parallel decoding of product codes according to the invention is to eliminate the memory planes associated with the matrices generated by a product code between the different half-iterations. It is then necessary to manage the communication of the symbols of the different words of the matrix between the decoding of the lines and of the columns. A solution according to the invention consists in placing an interconnection network 50 between the line decoder assembly 60 and the column decoder assembly 70, as shown in FIG. 9, and thereby interconnecting the decoders of the assembly 60 with the is coders of the assembly 70.

This interconnection network 50 can be embodied by straightforward point-to-point connections or by a Crossbar network.

Figure 11:
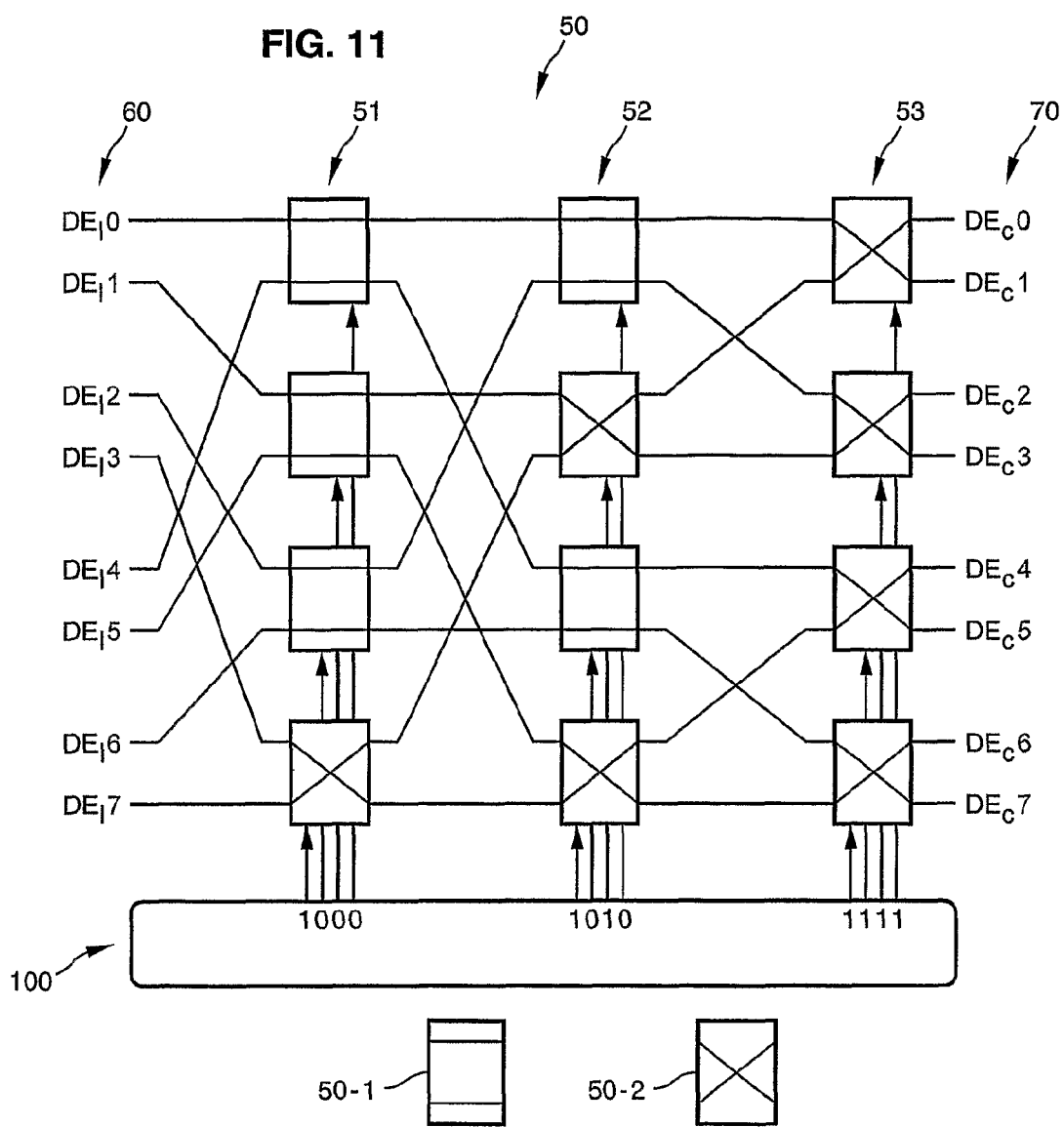

In the context of the invention, a dynamic interconnection network may be preferred, like the one shown in FIG. 11, since a dynamic network is a network whose connection topology varies over time.

This type of network 50 makes it possible to process the symbols by dividing them over all of the decoders of the next half-iteration according to a communication profile of the circular permutation type. Moreover, the network for interconnecting the architecture according to the invention processes n communications simultaneously.

With reference to FIG. 11, the dynamic network 50 selected here is of the multi-stage type. The advantage of this structure relative to a point to point connection or Crossbar based solution is to limit the number of connections and switches. Indeed, in multi-stage networks, a number of connections and the number of switches evolve logarithmically:

number of connections:(n*Log$_2$n)

number of switches:((n*Log$_2$n)/2)

The switches (51, 52, 53) generally contain two inputs and two outputs. They are assembled in the form of a rectangular table of dimension n lines and Log$_2$n columns. The number of stages is therefore Log$_2$n.

Figure 10:
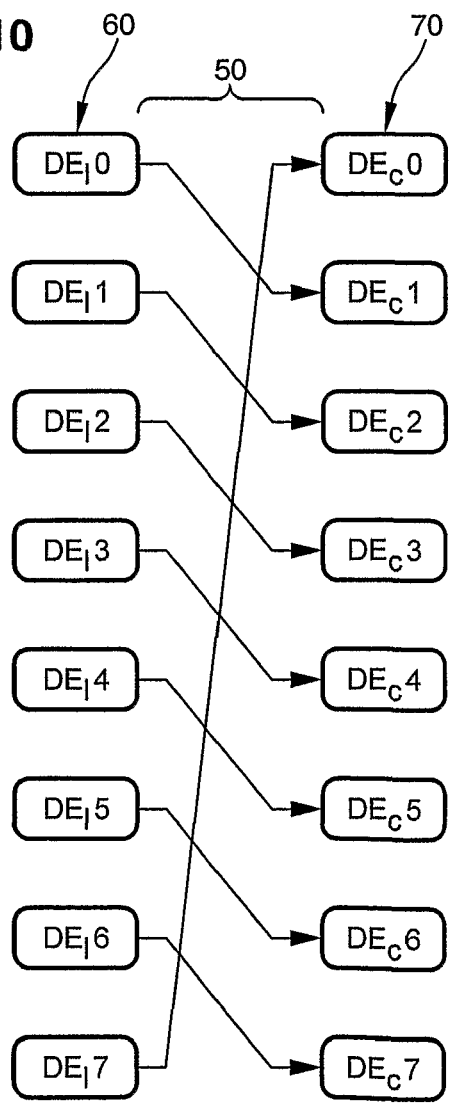
FIGS. 10 and 11 show an example of an interconnection network between decoders according to the invention, the interconnection network here being in a preset state.

In particular, the multi-stage dynamic interconnection network of the Omega type which is found in the architectures of parallel computer, is based on the principle of circular permutation. The connection algorithm therefore consists in offsetting circularly the passage of the information between the sources and the destinations. An example of communication between the elementary decoders for processing a 8*8 matrix along the lines then along the columns is shown in FIGS. 10 and 11: the state of the network 50 shown here corresponds therefore to the decoding stage according to FIG. 7B.

The switches are very straightforward circuits and inexpensive to implement, particularly using CMOS technology. A two position switch (positions 50-1 and 50-2) corresponds to four switches and an inverter. The complexity in equivalent logic gates is therefore 2.5 gates. The interconnection network 50 of the communication example in FIGS. 10-11 has a material complexity of 30$q$ logic gates (q being the number of quantification bits of the matrix symbols). The network also requires a controller 100 for positioning the switches according to the connections required.

I.2.1 Sequential Architectures.

Figure 12:
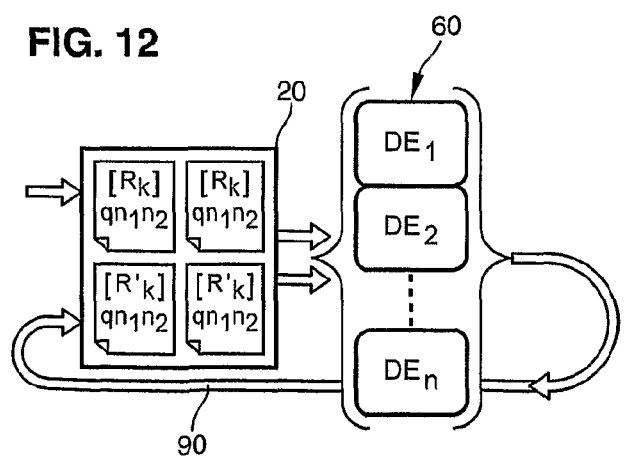
FIG. 12 shows a first type of sequential architecture processing half-iterations according to the invention.

According to a first type of sequential architecture according to the invention, with reference to FIG. 12, the circuit implements all the half-iterations from one single elementary module, this elementary module including a decoder assembly 60 able to decode in parallel (simultaneously) the matrix along the lines all the columns according to the process previously described, and a memory plane 20. A looping 90 between the module output and input ensures that the successive half-iterations can be carried out per symbol group.

The memory plane 20 can be composed of four memories of size q*$n_1$*$n_2$ bits irrespective of the number of iterations performed. Two of the four memories operate in read mode, the other to operate in write mode. There is an inversion of the operating modes (read/write) of the memories $R'_k$ between each half-iteration. For the memories of $R_k$, inversion of the operating mode occurs on receipt of a new information matrix. The memories may be conventional RAM accessible by addressing along the lines and the columns.

The decoder assembly 60 is here composed of n elementary decoders. From one iteration to another, this decoding assembly 60 processes in parallel a group of symbols along the lines, then along the columns (or conversely). A stage for memorising the data in the memory plane 20 is provided between each half-iteration.

The flow rate of this first type of sequential parallel architecture is n times higher than that of the conventional sequential architecture.

Figure 13:
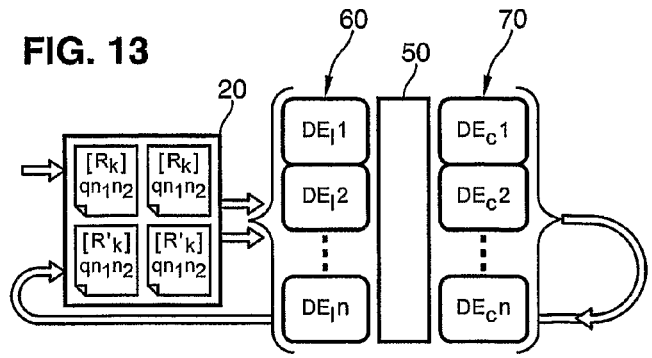
FIG. 13 shows a second type of sequential architecture processing iterations according to the invention.

According to a second type of sequential architecture according to the invention, with reference to FIG. 13, the circuit performs all the iterations from a single elementary module, this elementary module including two decoder assemblies 60 and 70 able to decode it parallel (simultaneously) the matrix along, respectively, the lines at the columns (according to the process previously described), and a memory plane 20. A looping 90 between the module output and input ensures that the successive iterations are carried out per symbol group.

The memory plane 20 can be composed of four memories of size q$n_1 n_2$ bits irrespective of the number of iterations performed. Two of the four memories operate in read mode, the other to operate in write mode. There is an inversion of the operating modes (read/write) of the memories $R'_k$ between each iteration. F or the memories $R_k$, the inversion of the operating mode occurs on receipt of a new information matrix. The memories may be conventional RAM accessible by addressing along the lines at the columns.

The decoder assemblies 60 and 70 are here each composed of n elementary decoders. During an iteration, the decoding assembly 60 processes in parallel a group of symbols along the lines (or the columns), then the decoder assembly 70 processes it parallel group of symbols along the columns (or the lines). At interconnection network 50 provided between the two decoder assemblies 60 and 70 ensures that the decoded data of a group of symbols is transmitted from one decoder assembly to another, as explained previously.

Advantageously, when the decoder assembly 70 processes a group of symbols, the decoder assembly 60 processes another group of symbols.

The flow rate of this second type of sequential architecture according to the invention is 2*n times greater than in a conventional sequential architecture.

A step for memorising the data in the memory plane 20 is not provided, here, between each processing along the lines and the columns, contrary to the first type of sequential architecture according to the invention.

This latency, for processing one iteration of the matrix, is $(L_1+L_2)$ symbols. The overall latency there'd introduced by one or other of the sequential architecture is according to the invention must therefore be at most $2*n_1 * n_2$ ($n_1 * n_2$ symbols for filling a matrix and $n_1 n_2$ symbols for the iterative processing of this matrix). The overall latency is therefore independent of the number of iterations. However, care needs to be taken that the number of iterations it allows the authorised the maximum latency to be respected, in other words:

$$L_{atency}=(L_1+L_2)*it<n_1 n_2$$

I.2.2 "Pipeline" Architectures.

The pipeline technique for integrating a turbo decoder is based on a modular architecture. In a pipeline architecture according to the invention, each module i (i being between 1 and the number it of iterations) includes two decoder assemblies 60-i and 70-i able to decode in parallel (simultaneously) the matrix following, respectively, the lines and the columns (according to the process previously described), or conversely, and two interconnection networks 50-i and 80-i, a first interconnection network 50-i located between the decoder assemblies 60-i and 70-i and a second interconnection network 80-i located at the output of the second decoder assembly 70-i. The modules are arranged in a cascade, the first decoder assembly 60-i of each decoder being connected to the second interconnection network 80-(i−1) of the previous module; with the exception of the first module which is powered by a data receive memory 20.

The final architecture is therefore constituted by as many modules as iterations it.

Each decoder assembly 60-i and 70-i is here composed of n elementary decoders.

Figure 6:
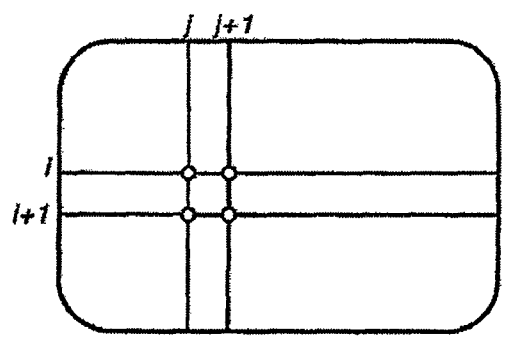
FIG. 6 shows a matrix illustrating the principle of parallel decoding according to the document WO 92/39587.
Figure 8E:
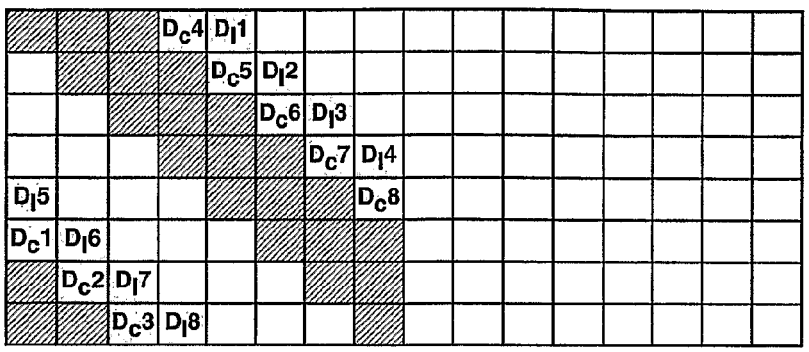
Figure 8F:
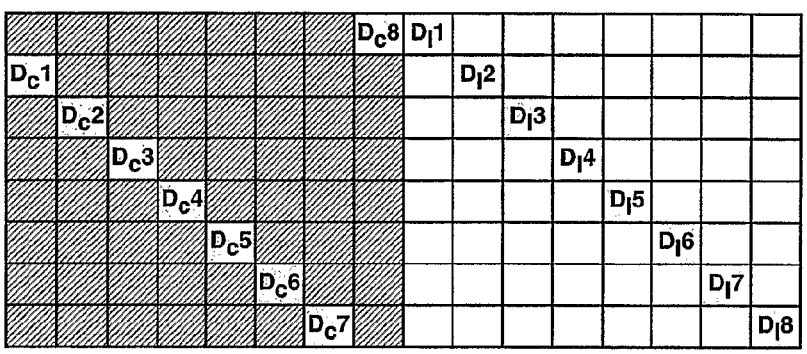
Figure 8G:
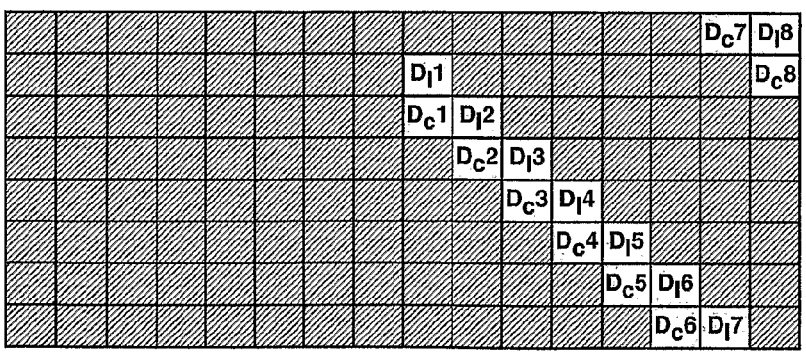
Figure 8H:
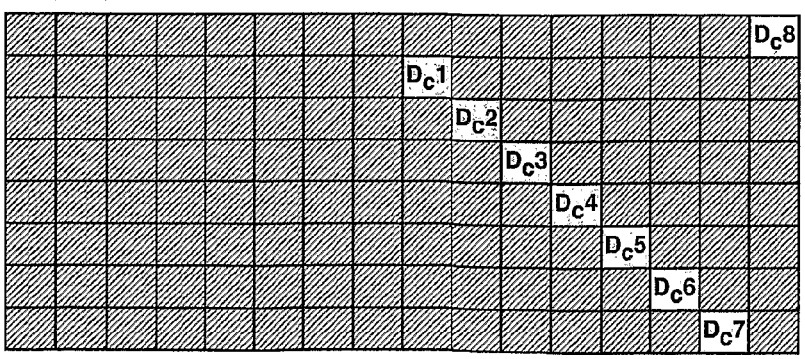
Figures 16A, 16B, 16C, 16D:
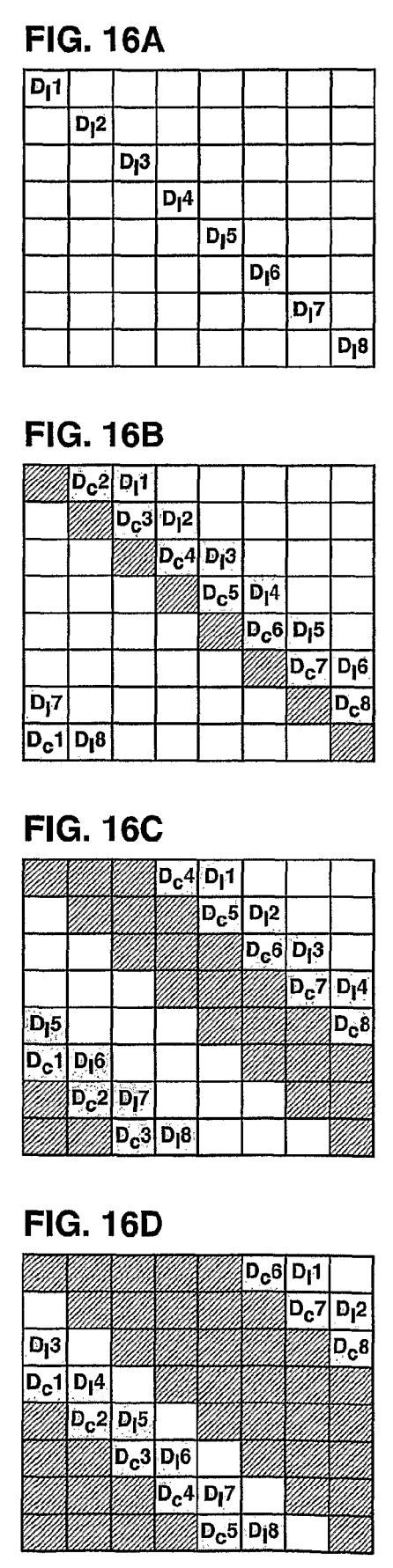

The interconnection networks 50-i and 80-i are to advantage controlled such that, when a group of symbols is fully processed during an iteration (c.to.d. by a given module), the decoded data is transferred immediately towards the next iteration (i.e. towards the next module) for decoding the next iteration. Thus, by way of illustration, FIGS. 16A to 16D d give respectively simple processing state in respect of four successive iterations i, i+1, i+2 and i+3 at a given moment, in a square matrix 8*8. It can be seen here in this example that, not only does the structure with two decoder assemblies per module allow two symbols groups to be processed simultaneously per iteration (FIGS. 16B and 16C), but that the cascade structure also makes it possible to process, still simultaneously, symbols groups in other iterations implemented in parallel by other modules. It can thus be seen that, while decoding during the iteration i is about to end (FIG. 6A), the decoding of the iteration i+3 is starting (FIG. 16D). Its flow rate is therefore increased accordingly.

Figure 14:
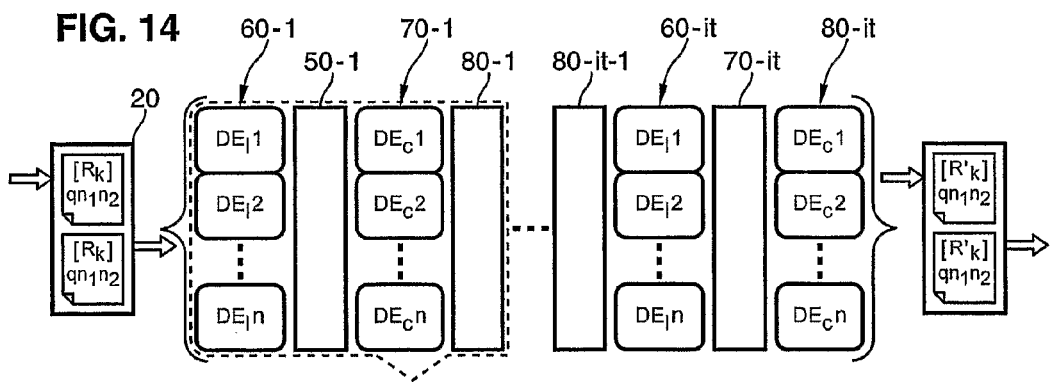
FIG. 14 shows a first type of pipeline architecture according to the invention.

With reference to FIG. 14, the architectural solution according to the invention requires at most only four memories of size $q*n_1*n_2$ bits. Some of these memories may be eliminated depending on the environment in which the turbo decoder is to be found.

The space requirement of the circuit according to the invention therefore relates mainly to the decoder assemblies 60-i and 70-i. Complexity due to the memory planes is therefore much less than for the conventional pipeline architecture solution.

Moreover, as the memorisation of the matrices $R_k$ (information received from other channel), $R'_k$ (information coming from the previous half-iteration) and $R_k^+$ (information sent at the next half-iteration) is no longer necessary between the half-iterations, the overall latency is also much less significant. The processing latency of the matrix C for it iterations of this type of architecture is therefore:

$$L_{atency}=(L_1+L_2)*it \text{ for it iterations}$$

The main advantage of any pipeline architecture is the data-processing rate which can be reached, the reached rate being the processing rate of a module. In the context of the invention, this rate is therefore n times greater than that of conventional pipeline architecture (see FIG. 16A-16D by way of illustration).

Figure 15:
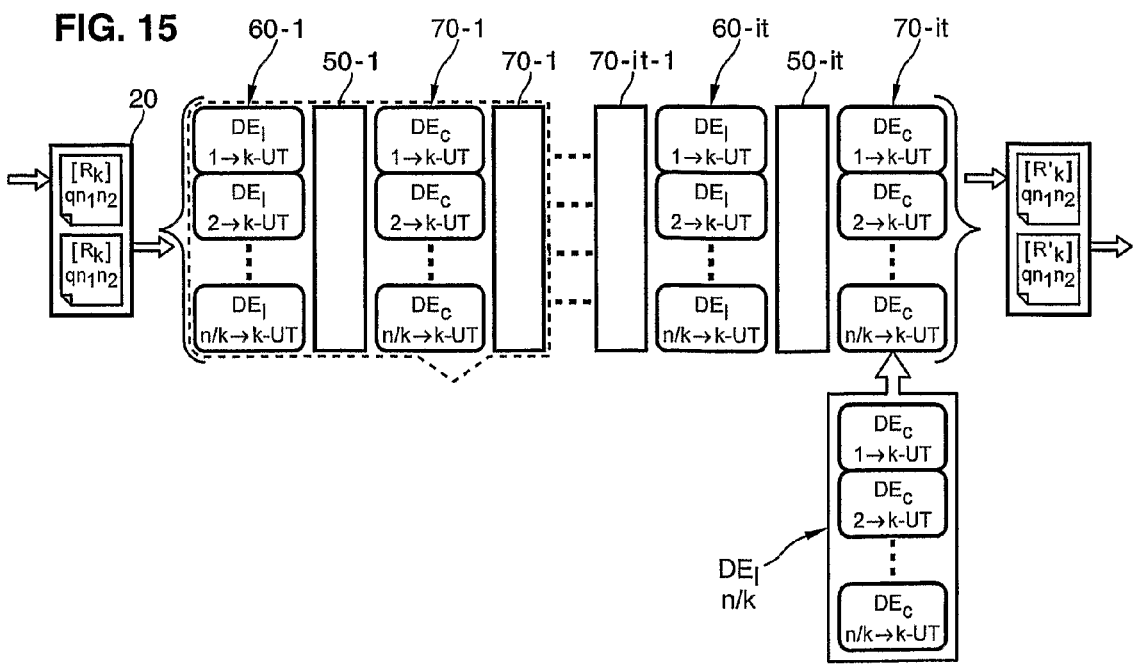
FIG. 15 shows a second type of pipeline architecture according to the invention.

Moreover, it is possible to increase this rate still further by using the architecture according to FIG. 15. This architecture is identical to that in FIG. 14, except for the fact that the decoder assemblies 60-i and 70-i have a number n of respective decoders less than n1 and n2. Indeed, these decoder assemblies 60-i and 70-i include at least one decoder able to simultaneously process k symbols of one line (or of one column) (k being greater than or equal to 2). Each of these decoders "k-UT" can be broken down into k elementary decoders capable of simultaneously processing k symbols of one and the same word. In particular, the choice may be made in respect of each decoder assembly 60-i and 70-i, to take only such decoders, their number in a decoder assembly then being n/k. This type of decoder is particularly used in WO 02/39587 and has already been described earlier with reference to FIG. 6.

The pipeline structure can be configured according to the invention (with reference to FIG. 15) such that the complexity in terms of the number of elementary decoders is similar to that of the pipeline structure according to FIG. 14, in other words 2n elementary decoders per iteration.

The complexity of the elementary decoder k-UT is about k/2 times greater than that of a conventional elementary decoder 1-UT, but the space requirement of the final circuit is less and its flow rate is increased by $$\frac{n}{k} \times k^2.$$

Furthermore, the latency of a complete iteration is $(L_1/k+L_2/k)$ symbols, since the elementary decoder processes k symbols of a word simultaneously. The processing latency of the matrix C for it iterations of this type of architecture is therefore:

$$L_{atency}=(L_1/k+L_2/k)*it \text{ for it iterations}$$

The latency is therefore less than k*it times that of pipeline architecture according to FIG. 14. This latency is very weak if we compare it with those obtained in conventional pipeline architectures.

A very major advantage of this pipeline architecture according to the invention is furthermore the flow rate which can be attained. It is thus possible to integrate product code turbo decoder circuits having flow rates greater than 10 Gbits/s. Thus, the flow rate gain is a factor $(n/k)*k2$ higher than a conventional pipeline architecture. Moreover, this flow rate gain remains high (n/k) relative to the pipeline architecture solution proposed in the document WO 02/39587.

The data-processing rate can thus be increased while retaining a constant frequency for the memory plane and the decoder.

Henceforth, the architecture according to the invention is a product code turbo decoder architecture of weak latency for the very high flow rate.

I.3 Results

For illustrating the contribution made by decoding architectures according to the invention, hereinafter are compared the performance of a benchmark turbo decoder, a high-speed turbo decoder studied in the thesis by J. Cuevas ("High-Speed Product Code Turbo Decoding", a doctoral thesis from the University of South Brittany, Brest, 6 May 2004), and a turbo decoder according to the invention, using the pipeline architecture shown in FIG. 15. The product code which is used therein is constituted by two extended BCH codes (32,26,4). Table 1 gives the performance in terms of flow rate and latency for processing the decoding of the matrix 32*32 for one half-iteration. The complexity in the number of logic gates is also supplied. It should be noted that for high-speed and very high-speed decoders, elementary decoders process four symbols simultaneously (4-UT according to the terminology seen above). The integration technology is CMOS 0.18 μm from STMicroelectronics.

TABLE 1

| Decoding 32 * 32 | k-UT | Flow rate (Mbits/s) | Latency (number of symbols) | Decoder complexity (number of gates) | Memory capacity (number of bits) | Connection network complexity (number of gates) |
|---|---|---|---|---|---|---|
| Reference architecture | 1-UT | 100 | 64 | 5,500 | 20,480 | 0 |
| High rate architecture J. Cuevas | 4-UT | 1,600 | 16 | 44,000 | 20,480 | 0 |
| Architecture according to the invention | 4-UT | 12,800 | 16 | 352,000 | 0 | 1,000 |

It can be noted that in this example the flow rate of the architecture according to the invention (12.8 Gbits/s) is 128 times higher than the reference flow rate. Moreover, this flow rate is 8 times higher than that obtained by the architecture in the thesis by J. Cuevas. The latency is divided by four.

The material cost occasioned according to the invention at the level of elementary decoders is 64 times higher than the reference architecture and 8 times higher than the architecture in the thesis by J. Cuevas. Nevertheless, the pipeline architecture according to the invention eliminates the memory planes between each half-iteration and between each iteration. This disappearance of the memory planes compensates, at least partially, for the material complexity introduced at decoder level.

Moreover, if we consider the ratio of the number of decoder gates per Mbits/s, it will be noted that it is about 55 for the reference architecture and about 27.5 for the other two architectures. The material charge of the Mbits/s is therefore divided in two.

Table 2 is a summary table highlighting the performance of the family of architectures according to the invention previously studied (sequential and pipeline), in terms of latency and flow rate.

TABLE 2

| | Conventional architecture | | | Parallel architecture | | |
|---|---|---|---|---|---|---|
| | Sequential | Pipeline | | Sequential | Pipeline | |
| | 1-UT | 1-UT | k-UT | 1-UT | 1-UT | k-UT |
| Latency (number of symbols) | $<2 * n_1 n_2$ | $2it * n_1 n_2 + it * (L_1 + L_2)$ | $2it * n_1 n_2 + it * ((L_1 + L_2)/k)$ | $N_1 n_2 + (it = (L_1 + L_2) < 2 * n_1 n_2)$ | $it * (L_1 + L_2)$ | $It * ((L_1 + L_2)/k)$ |
| Flow rate (Mbits/s) | $D_{ref}$ | $D_{ref} * 2it$ | $D_{ref} * 2it * k^2$ | $D_{ref} * n_{min}$ | $D_{ref} * 2it * n_{min}$ | $D_{ref} * 2it * (n_{min}/k) * k^2$ |
| Number of elementary decoders | 1 | $2it$ | $2it * k * (k/2)$ | $n_{min}$ | $n_{min} * 2it$ | $(n_{min}/k) * 2it * k * (k/2)$ |
| Memory capacity (in bits) | $4qn_1 n_2$ | $4qn_1 n_2 * 2it$ | $4qn_1 n_2 * it$ | $4qn_1 n_2$ | 0 | 0 |
| Number of interconnection networks | 0 | 0 | 0 | 0 | $2it - 1$ | $2it - 1$ |

In addition to the improvements that can be seen in this last table, it should be pointed out that this family of architecture is eliminates the memory planes associated with a product code's data matrices between the half-iterations for pipeline structures. Furthermore, the second type of sequential architecture according to the invention (see FIG. 13) eliminates the memory planes between each processing by lines and columns.

It said the circuit is thereby all the less cumbersome. This elimination or reduction in memory planes involves the use of an interconnection network between half-iterations, which is inexpensive in terms of complexity.

Moreover, even if complexity at elementary decoder level is increased, the material cost per Mbits/s is however reduced.

An illustration of the summary table is also provided in table 3 for the particular example of a product code turbo decoder using the extended BCH code (32.26.4).

TABLE 3

| | Conventional architecture | | | Parallel architecture | | |
|---|---|---|---|---|---|---|
| | Sequential | Pipeline | | Sequential | Pipeline | |
| | 1-UT | 1-UT | k-UT | 1-UT | 1-UT | k-UT |
| Latency (number of symbols) | <2 048 | 17 408 | 16,640 | 2,048 | 1,024 | 256 |
| Flow rate (Mbits/s) | 6.25 | 100 | 1,600 | 200 | 3,200 | 12,800 |
| Number of elementary decoders | 1 | 16 | 128 | 32 | 512 | 1 024 |
| Memory capacity (in bits) | 20,480 | 327,680 | 327,680 | 20,480 | 0 | 0 |
| Number of interconnection networks | 0 | 0 | 0 | 0 | 15 | 15 |

In this way, decoding according to the invention makes it possible to increase the data processing rate while reducing the overall latency of the circuit.

Moreover, this approach eliminates the memory planes between the half-iterations for pipeline architectures.

Furthermore, the material charge per Mbits/s is substantially reduced.

Lastly, if the parallel decoders according to WO 02/39587 are used in parallel architectures according to the invention, the resulting turbo decoder circuits may have flow rates above 10 Gbits/s.

II. 2nd Type of Decoding

This $2^{nd}$ type of decoding repeats a general principle of the invention which is to decode symbols in lines and in columns by successive symbols groups.

Unlike the $1^{st}$ type of decoding, this $2^{nd}$ type of decoding uses a series of elementary line decoders $D_l i$ (i being between 0 and the number of lines of C) and a combinatory column decoder $D_c$ (or obviously, the reverse: elementary column decoders and a combinatory line decoder).

A combinatory decoder is capable of simultaneously decoding all the symbols of a word for the decoding of a line or a column.

With reference to FIGS. 17A to 17G, are shown different stages in processing an 8*8 square matrix in this way, during one and the same iteration.

For the purposes of decoding, 9 decoders are provided (8 elementary ones for the lines and 1 combinatory one for the columns). A line decoder assembly is thus here constituted by 8 line decoders ($D_l i$ with i ∈ [1,8]) processing 8 words of 8 symbols. A column decoder assembly is here constituted by 1 combinatory column decoder ($D_c$ with j ∈ [1,8]) also processing 8 words of 8 symbols. Each of these decoders (line or column) may then implement turbo decoding according to FIG. 2 or 3.

With reference to FIG. 17A, a first stage of decoding a column (or line) vector according to the invention, consists in decoding the vector in parallel.

To this end, the 8 (or n1—or n2—more generally) elementary decoders, in other words decoders able to decode one symbol at a time, may be implemented in parallel.

With reference to FIG. 17B, a second stage of decoding the column (or line) vector then starts as soon as all the symbols of the vector have been decoded according to the first stage. This second stage is implemented by said combinatory decoder able to decode 8 (or n1—or n2—more generally) symbols simultaneously.

At the end of these two stages, the vector in question is then fully decoded (see FIG. 17C).

The new group symbols is processed identically to the previous one, firstly in parallel (FIG. 17B) then simultaneously by combinatory processing (FIG. 17C). It is then fully processed during the current iteration (FIG. 17D).

Advantageously, said elementary decoders decoded according to the first stage another vector simultaneously with the second decoding. Thus, decoding time is optimised, and the first and second respective decodings can be performed continuously, the combinatory decoder passing successively through each of the vectors previously processed by the elementary encoders.

Thus, any memory plane between the two decodings is eliminated, unlike known techniques which required a memory able to memorise a matrix of n1*n2 between the two decodings (discussed above).

The matrix C is then fully decoded, during the current iteration, in lines and in columns identically to the $1^{st}$ and $2^{nd}$ symbols groups (see FIGS. 17A to 17G).

If we consider a complete iteration, the decoding latency of the 8*8 square matrix following the lines then the columns is then 16x.

In a trivial way, the technical teaching of this example can be applied to the general case of decoding a concatenated matrix with uniform interleaving, square or non-square having a dimension n1*n2 (n1 lines and n2 columns), with n1 (or n2) elementary decoders and 1 combinatory decoder.

If we consider a complete iteration, the decoding latency of the matrix C following the lines then the columns is then L symbols, $L=x*(n1+n2)$.

It should here be noted that the latency between the decoding of the lines and the decoding of the columns is nil, given that there is a lack of memory plane between the two, these two decodings following each other without intermediate memorisation.

II.2 Turbo Decoding

Figure 18:
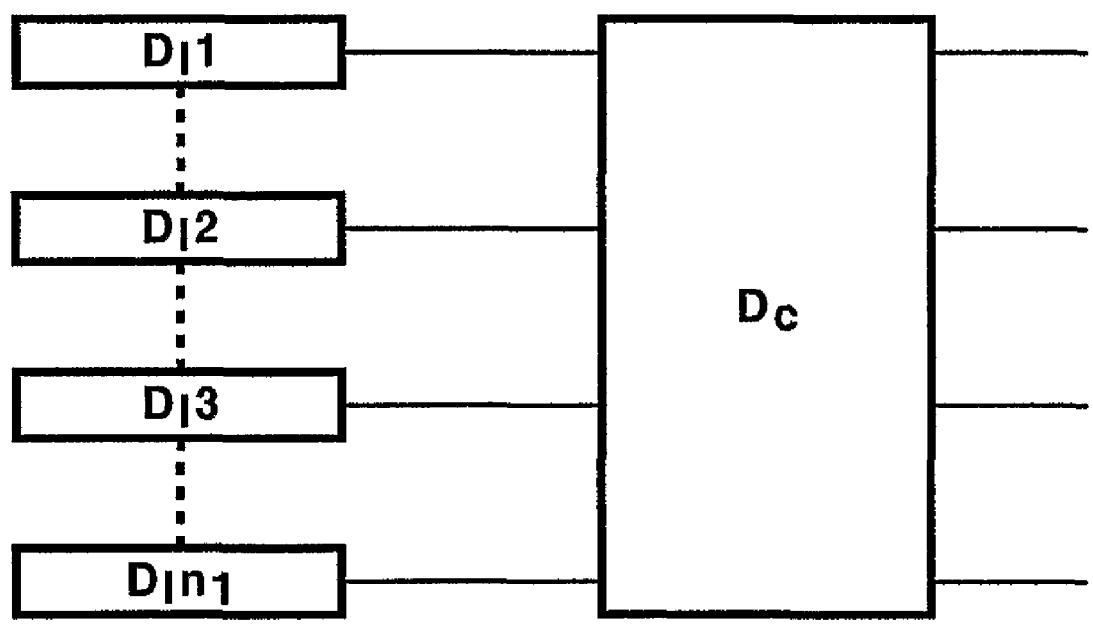
FIG. 18 shows in diagrammatic form a decoding module architecture according to the invention.

One of the advantages of parallel decoding of product codes according to the invention is to eliminate the memory planes associated with the matrices generated by a product code between the different half-iterations. It is then necessary to manage the communication of symbols of the different words of the matrix between decoding the lines and the columns. A decoding module according to the invention is presented in FIG. 18. This module, unlike the decoding modules of the $1^{st}$ type (section 1), does not include an interconnection network, but simple parallel connections between the elementary decoders $D_l i$ (i here being between 1 and n1) and the combinatory decoder $D_c$.

This module represents an iteration. To allow the iterations to follow one another, the outputs of the combinatory decoder Dc can then be looped with the inputs of the elementary decoders $D_l i$ (sequential structure) or to provide several of these modules and to connect them in series (pipeline structure). The technical teachings previously described can then be adapted trivially for the first type of decoding according to the invention, to this second type of decoding.

B. Encoding

In this second part is presented an encoding process and an architecture allowing such encoding. This architecture processes the $k_1$ and $k_2$ words of useful binary data, (i.e. information data) of a useful data matrix with $k_1$ lines and $k_2$ columns, simultaneously by the two codes $C_1$ and $C_2$.

Figure 1:
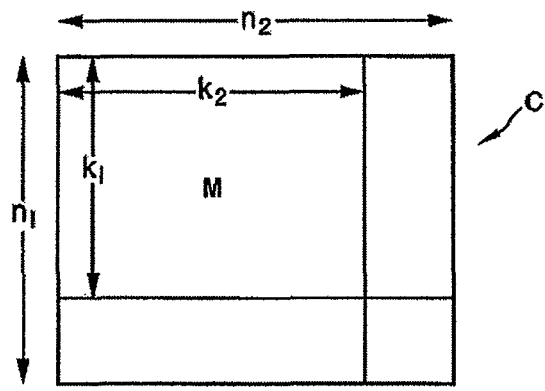
FIG. 1 shows in diagrammatic form a product code matrix.

In particular here, the encoding principle makes it possible to construct a matrix of concatenated codes with uniform interleaving, such as a product code matrix presented in FIG. 1. The codes used may be convolutive or in linear blocks.

The encoding operation for codes in linear blocks corresponds to a polynomial division of the information to be transmitted by the polynomial generating the agreed code.

Once constructed, such a matrix includes $n_1$ lines and $n_2$ columns corresponding respectively to $n_1$ and $n_2$ independent code words.

This is why the $k_1$ data words can be encoded in parallel if material resources (elementary encoders) are available. Likewise, the $n_2$ code words can be encoded in parallel.

Moreover, it is possible to encode simultaneously all the useful data of a word for the encoding of a line or a column if this useful data is available. To do this, the polynomial division is developed using the properties of the corps de Galois associated with the polynomial generating the agreed code. The encoder then corresponds to a tree structure of combinatory gates of EXCLUSIVE-OR functions.

A single so-called "combinatory" encoder is thus obtained that is able to encode simultaneously the data of a line or a column.

An elementary encoder uses an internal memory, such as a shift register, allowing a very provisional storage of the encoded data, unlike a combinatory encoder which has no memory effect.

According to a first stage of encoding a column (or line) vector according to the invention, the vector is encoded in parallel by one of the two codes C1 (or C2)

To this end, k1 (or k2) elementary encoders can be implemented in parallel, in other words encoders able to encode one useful data item at a time.

A second stage of encoding the column (or line) vector then starts as soon as all the useful data of the vector has been encoded according to the first stage. This second stage is implemented by said combinatory encoder able to encode k2 (k1) useful data simultaneously.

At the end of these two stages, the vector in question is then fully and coded.

Advantageously, said elementary encoders encode according to the first stage another vector simultaneously with the second encoding. In this way, encoding time is optimised, and the first and second respective encodings can be performed continuously, the combinatory encoder passing successively through each of the vectors previously processed by the elementary encoders.

In this way, any memory plane between the two encodings is eliminated, unlike known techniques which required an intermediate memory able to memorise a matrix of k1*n2 (or k2*n1) between the two encodings (discussed above).

1. Encoding a Square Matrix

FIGS. 19A to 19H show different stages of such an encoding of a square matrix of useful data of size 4*4. A matrix of useful data is shown by the solid line square filled with 4*4 boxes, each box representing a useful data item. This matrix therefore includes 4 line vectors (or line words) and 4 column vectors (or column words).

Here, the encoding is implemented so as to construct a product code matrix of size 7*7, using the BCH code (7,4,3). The figures thus show a memory plane of size 7*7, necessary for memorising the encoding matrix.

For the purposes of encoding 5 encoders are used (4 for the lines and 1 for the columns). The 4 elementary line encoders ($C_l i$ with i ∈ [1,4]) process 4 words of 4 data in parallel. Each elementary encoder processes one data item at a time. The combinatory column encoder $C_c$ processes 7 words of 4 symbols. The combinatory encoder as defined above is capable of simultaneously processing 4 symbols of the block 4*7.

Figure 19A:
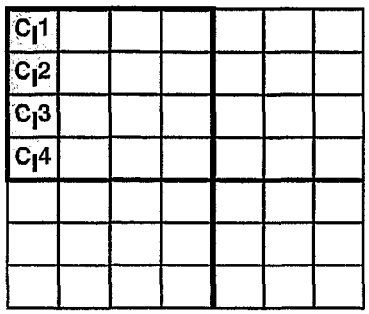
FIGS. 19A to 19H show different stages in encoding a square matrix according to the invention.

With reference to FIG. 19A, the matrix is processed, in parallel by said four elementary encoders, he is starting with the 4 symbols finding themselves on the first column according to said first stage.

Figure 19B:
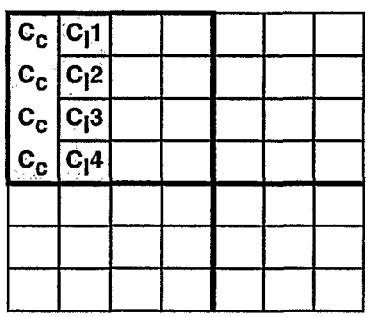

Then, with reference to FIG. 19B, the second stage is implemented by the combinatory column encoder ($C_c$), on the same data which has previously been processed by the line encoders.

Figure 19C:
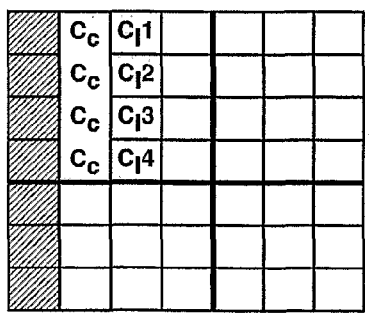

As indicated above, at the end of this second stage, the processed column vector (here the first column vector) is fully encoded in the column: this is what is meant by the black boxes in FIG. 19C.

Figure 19D:
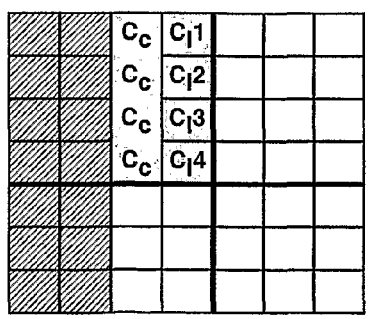
Figure 19E:
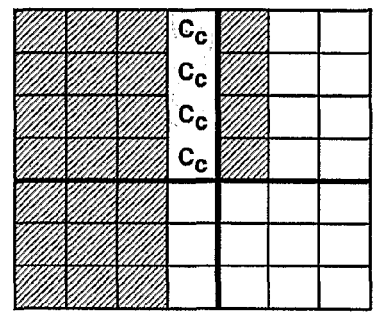

The next column vector (here the second one) is then processed. This new vector is then processed in an identical way to the previous one, firstly simultaneously by means of the line vectors (FIG. 19B) then simultaneously by means of the combinatory column vector (FIG. 19C) so as to be fully processed during the current iteration (FIG. 19D).

Advantageously, the second column vector is processed in lines by the elementary line encoders ($C_l i$), whereas said combinatory column vector ($C_c$) processes the first column vector (FIG. 19B).

It should be noticed that if, here, the index indicating the passage from one data item to another in a word, for processing by the encoders, is incremented by 1 according to the columns, the passage of an encoding from one word to another can be governed by other rules as long as these rules are able to determine in the end a full encoding of the matrix.

The 4*4 data matrix is then fully encoded in lines and columns identically to the $1^{st}$ and $2^{nd}$ column vectors (see FIGS. 19A to 19E).

When the elementary encoders ($C_l i$) have been implemented for all the useful data of the 4*4 matrix, encoding along the lines is then terminated.

It remains to terminate encoding along the columns, in other words to terminate the encoding of the 4*4 data matrix and 4*3 line redundancy matrix.

Figure 19F:
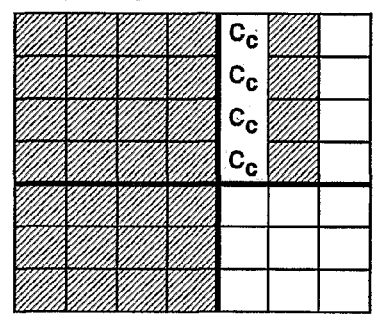
Figure 19G:
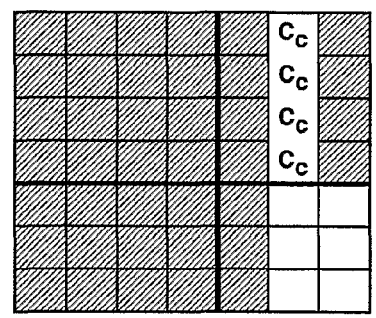
Figure 19H:
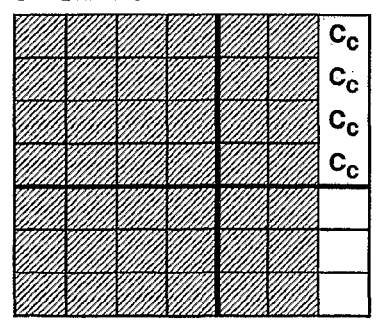

To this end, the combinatory vector processes the last column vector of the 4*4 matrix (FIG. 19E) and, successively, the 3 column vectors of the line redundancy matrix (FIGS. 19F to 19H).

The constructed matrix, of size 7*7, is then fully and coded.

The time for processing a binary information data matrix is defined as the number of units of time (clock periods) required to obtain the encoded matrix. In the case of the 4*4 data matrix, the processing time along the lines are along the columns is seven (4 for the data symbols and 3 for the redundancy symbols). The processing time along the lines them along the columns is eight, given the offset of a unit of time between the processing of the lines and that of the columns.

In a more general way, when it is required to encode an initial matrix of size k*k by encoding by means of two codes in identical elementary blocks C(n, k, δ), the product code is presented in the form of a matrix C with n lines and n columns.

If we have k elementary encoders and a combinatory encoder processing k symbols simultaneously, then it is possible to encode k lines and n columns in parallel.

The duration of the encoding of the matrix C along the lines or along the columns is then n (for the data and the redundancy).

Lastly, the duration of the encoding of the matrix C along the lines then the columns is (n+1).

2 Encoding a Non-Square Matrix

The matrix to be encoded is here of dimension k1*k2.

One of the objectives of encoding according to the invention is to eliminate the memory plane between the encoding along the lines and the encoding along the columns.

This involves, according to the invention, having elementary encoders and a parallel encoder.

If the numbers of lines and columns of a matrix are different, then two solutions are possible. A first solution consists in taking $k_1$ elementary encoders for encoding along the lines and a combinatory encoder simultaneously processing $k_1$ symbols for encoding along the columns. The second solution consists in taking $k_2$ elementary encoders for encoding along the columns and a combinatory encoder simultaneously processing $k_2$ symbols for encoding along the lines.

With reference to FIGS. 20A to 20F are shown different stages of encoding a 4*12 matrix, constructed using the BCH(8,4,4) and BCH(16,11,4) codes, and therefore for constructing an encoded matrix of size 8*16.

5 encoders (4 for the lines and 1 for the columns) are used. The 4 elementary line encoders ($C_l i$ with $i \in [1,4]$) process 4 words of 12 useful data items. Each elementary encoder processes one useful data item at a time (conventional sequential processing).

The combinatory column encoder $C_c$ processes 16 words of 4 symbols. The parallel encoder such as we have defined it is capable of simultaneously processing 4 symbols of the 4*16 block.

Figure 20A:
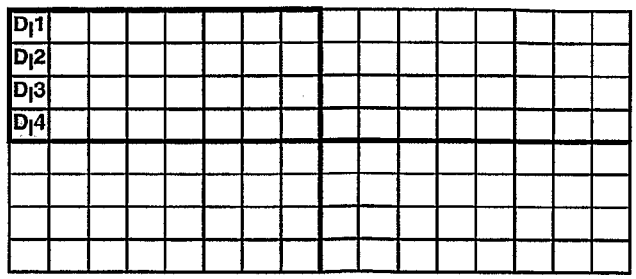
FIGS. 20A to 20F show different stages in encoding a non-square matrix according to the invention.
Figure 20B:
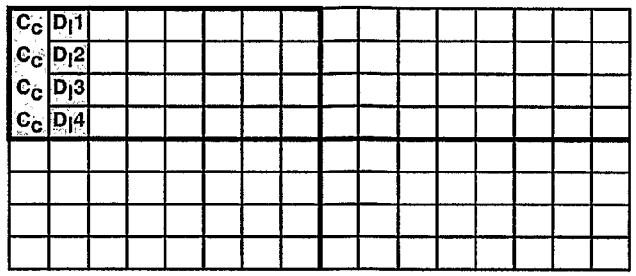
Figure 20C:
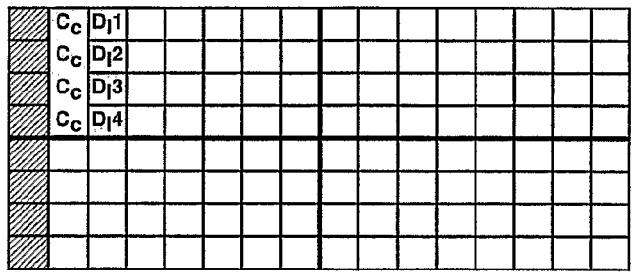
Figure 20D:
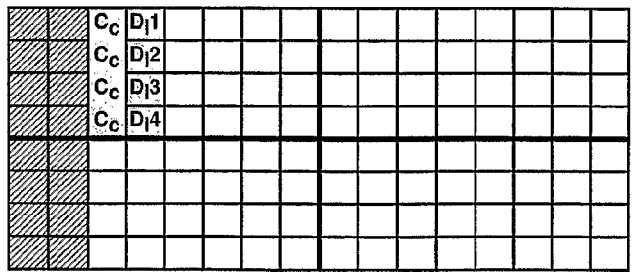

With reference to FIGS. 20A to 20C, the whole 4*12 matrix is processed (starting with the 4 useful data items finding themselves in the first column) in a substantially identical way to the case of a square matrix.

Figure 20E:
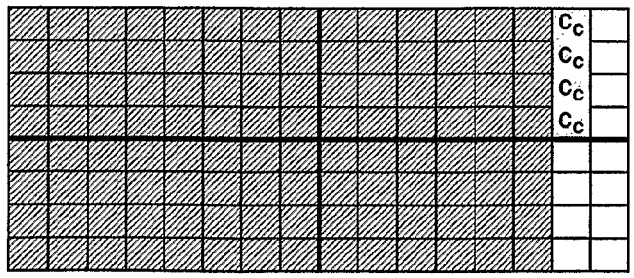
Figure 20F:
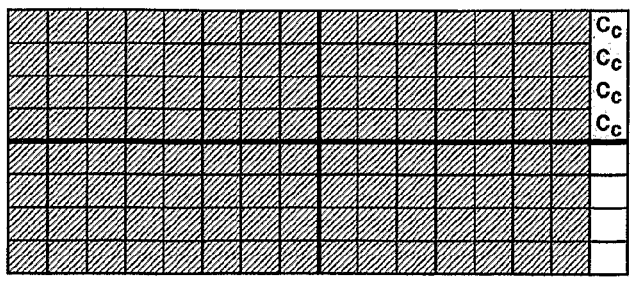

With reference to FIGS. 20E and 20F, the combinatory encoder terminates the encoding of the matrix in a similar way to that relating to a square matrix.

A matrix constructed 8*16 is then obtained.

The duration of encoding the matrix along the columns or along the line is 16 (for the data and the redundancy).

The duration of encoding of the matrix C along the lines then the columns is then 17.

In a more general way, if we consider two codes in elementary blocks $C_1(n_1, k_1, \delta_1)$ et $C_2(n_2, k_2, \delta_2)$, the product code is presented in the form of a matrix with $n_1$ lines and $n_2$ columns. Two configurations are then conceivable:

a—) we have $k_1$ elementary encoders and one combinatory encoder processing $k_1$ symbols of a word simultaneously. It is possible to encode $k_1$ lines and $n_2$ columns in parallel.

The duration of encoding the matrix C along the lines or along the columns is then $n_2$ (for the data and the redundancy).

Lastly, the duration of encoding the matrix along the lines then along the columns is $(n_2+1)$.

b—) we have $k_2$ elementary encoders and one combinatory encoder processing $k_2$ symbols of a word simultaneously. It is possible to encode $k_2$ columns and $n_1$ lines in parallel.

The duration of encoding the matrix along the columns or along the lines $n_1$ (for the data and the redundancy).

The duration of encoding the matrix C along the columns than along the lines is $(n_1+1)$.

Encoding a square or non-square matrix according to the invention possibly requires a memory plane of size equal to the matrix constructed (n1*n2), but in no way requires an intermediate memory plane (k1*n2 or k2*n1) given that the column vectors (or line sectors according to one trivial alternative) are alternately processed in lines and in columns (or the reverse) by the elementary encoders on the one hand and by the combinatory encoder on the other hand.

Encoding according to the invention therefore makes it possible to do away with the memory plane between the encoding of the lines and that of the columns.

On the other hand, the latency value corresponding to the memory plane is nil.

3. Encoding Architectures.

A technique has previously been described for the parallel encoding of product codes according to the invention.

Figure 21:
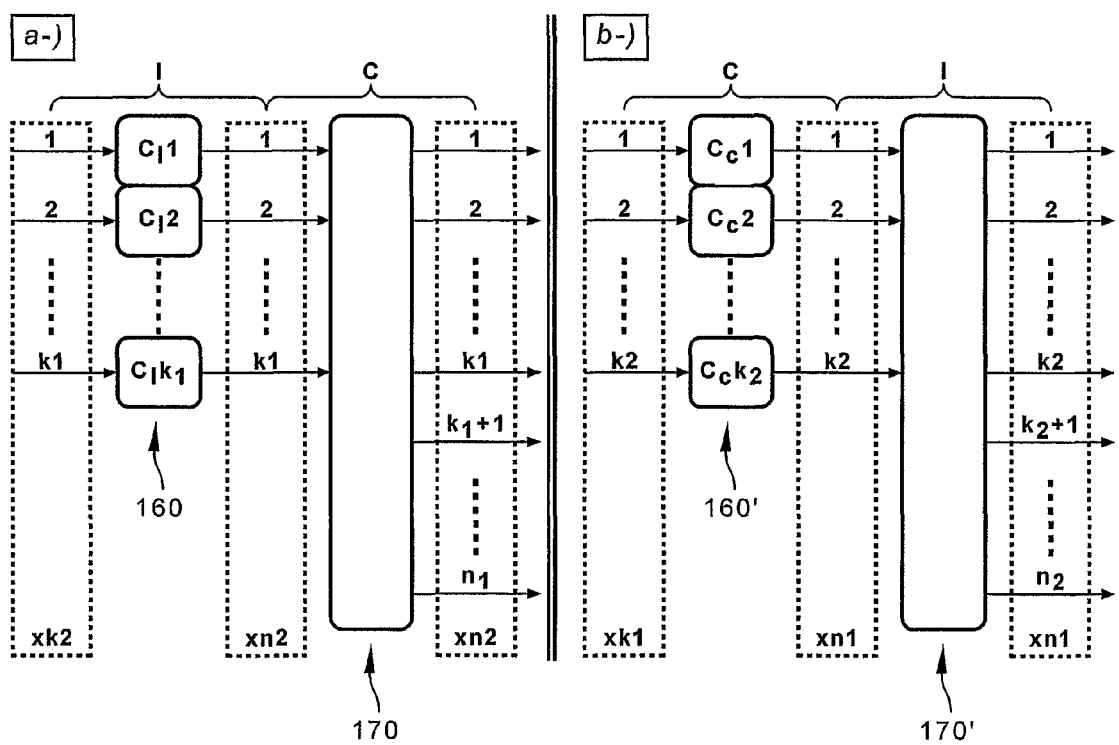
FIG. 21 shows to types of encoding architecture according to the invention.

The architecture of the corresponding encoder is composed of several elementary encoders processing one data item at a time and a combinatory encoder processing all the data of a line or a column simultaneously. With reference to FIG. 21, two architectural solutions for encoding a product code are presented:

a—) the first architectural solution consists in encoding along the lines then along the columns. In this case a unit 160 of $k_1$ elementary encoders ($C_l i$) and a combinatory encoder 170 processing $k_1$ symbols of a word simultaneously are provided. The data processed by the k1 line encoders is directly transmitted to the combinatory encoder 170.

b—) a second architectural solution consists in encoding along the columns then along the lines. In this case a unit 160' of $k_2$ elementary encoders ($C_c i$) and a combinatory encoder 170' processing $k_2$ symbols of a word simultaneously are provided. The data processed by the $k_2$ column in encoders is directly transmitted to the combinatory encoder 170'.

4. Results Obtained

Table 4 below makes it possible to compare performance in terms of flow rate, processing time and complexity of different architectural solutions. Two types of architecture are considered therein: sequential architectures and parallel architectures.

Sequential architectures correspond to the traditional approach to the encoding of product codes. The product code encoder is composed of an elementary encoder and a memory plane. The elementary encoder then carries out successively the two encodings (lines then columns).

The parallel architectures are those of the invention. A distinction is made in table 4 between architectures that perform the encoding along the lines then along the columns and those that perform the encoding along the columns than along the lines. The time for processing a binary information data matrix is defined as the number of units of time (clock periods) required to obtain the encoded matrix.

TABLE 4

| Product code | | Encoder flow rate | Processing time (number of clock | Number of encoders | | Memory capacity (number |
|---|---|---|---|---|---|---|
| $(n_1, k_1, \delta_1) * (n_2, k_2, \delta_2)$ | | (Mbits/s) | periods) | Elementary | Combinatory | of bits) |
| Sequential architecture | Line then column encoding | $D_{ref}$ | $n_1 * n_2$ | 1 | 0 | $k_1 * n_2$ |
| | Column and then line encoding | $D_{ref}$ | $n_1 * n_2$ | 1 | 0 | $k_2 * n_1$ |

TABLE 4-continued

| Product code $(n_1, k_1, \delta_1) * (n_2, k_2, \delta_2)$ | | Encoder flow rate (Mbits/s) | Processing time (number of clock periods) | Number of encoders | | Memory capacity (number of bits) |
|---|---|---|---|---|---|---|
| | | | | Elementary | Combinatory | |
| Ultra high-speed parallel architecture | Line then column encoding | $Dr_{ef} * 2 * k_1$ | $n_2 + 1$ | $k_1$ | 1 | 0 |
| | Column then line encoding | $Dr_{ef} * 2 * k_2$ | $n_1 + 1$ | $k_2$ | 1 | 0 |

To illustrate the contribution made by the invention (according to the parallel architecture), table 5 presents a comparison of performance for the product code encoder $(32,26,4)^2$. It is an encoder using the extended BCH code $(32,26,4)$.

TABLE 5

| Product code $(32, 26, 4)^2$ | Encoder flow rate (Mbits/s) | Processing time (number of clock periods) | Encoder complexity (number of gates) | Memory capacity (number of bits) |
|---|---|---|---|---|
| Sequential architecture | 250 | 1,024 | 127 | 832 |
| Ultra high-rate parallel architecture | 16,000 | 33 | 3,494 | 0 |

Table 5 gives performance in terms of flow rate and processing time for encoding the matrix 32*32. The complexity in the number of logic gates is also supplied. The integration technology is CMOS 0.18 μm from STMicroelectronics.

The flow rate of the architectural solution according to the invention (16 Gbits/s) is 64 times larger than the reference flow rate in the case of the product code encoder $(32,26,4)^2$.

The processing time is divided by about 32.

The material costs occasioned by the invention at encoder level is 26 elementary encoders and one combinatory encoder. The elementary and combinatory encoders have a respective charge of 127 and 192 gates.

Lastly, parallel encoding architecture eliminates the memory plane. This property partly compensates for the material complexity introduced at the encoder level.

Moreover, if we consider the ratio of the number of gates of the encoder per Mbits/s, then we note that it is around 0.5 for the traditional architecture and around 0.2 for the parallel architecture according to the invention. The material charge of the Mbits/s is therefore divided by about 2 and a half.

Encoding according to the invention therefore eliminates the memory plane associated with the data words between the two encodings. The approach proposed additionally makes it possible to encode the data words at flow rates that are far greater than those of traditional sequential architectures. Lastly, the time for processing binary information data by this type of architecture is much reduced.

The invention claimed is:

1. Method of decoding a matrix constructed from concatenated codes, corresponding to at least two elementary codes, with uniform interleaving, the matrix having n1 lines, n2 columns and n1*n2 symbols, said decoding being performed by a decoding module comprising a line-decoder assembly arranged for decoding the lines of said matrix and a column-decoder assembly arranged for decoding the columns of said matrix, wherein the method comprises processing all the lines- and columns-vectors of the matrix by groups of symbol groups, wherein the processing comprises:

a first decoding by said line-decoder assembly to simultaneously process all the symbols of a group of symbols according to their lines and then a second decoding by said column-decoder assembly to simultaneously process all the symbols of said group of symbols according to their columns, the symbol groups being thus successively processed according to their lines and their columns, or conversely, a first decoding by said column-decoder assembly to simultaneously process all the symbols of a group of symbols according to their columns and then a second decoding by said line-decoder assembly to simultaneously process all the symbols of said group of symbols according to their lines, the symbol groups being thus successively processed according to their columns and their lines, wherein the first decoding of a group of symbols is processed simultaneously to the second decoding of another group of symbols, which is different from said group of symbols.

2. Method of decoding according to claim 1, wherein the symbols of each group of symbols correspond to a line or a column of the matrix which is different of the line or the column, respectively, of the symbols of each one of other symbol groups.

3. Method of decoding according to claim 1, wherein location of a symbol in each group of symbols corresponds to a column and to a line which are both different from the column and the line locating each one of other symbols of the group.

4. Method of decoding according to claim 3, wherein number of symbols in a group of symbols is the same as number of symbols in other symbol groups, and wherein processed symbols of a new group are determined by their respective positions in the matrix, the positions being found from respective positions of the symbols of the group previously processed which are offset in line or in column by a predetermined index.

5. Method of decoding according to claim 4, wherein said predetermined index is an integer modulo the number of symbols by group.

6. Method of decoding according to claim 1, wherein the matrix is further decoded by successive sub-matrixes each constituting of symbol groups, each sub-matrix having locations of symbols different from those of the other sub-matrixes.

7. Method of decoding according to claim 6, wherein n2=u*n1 or n1=u*n2, u being an integer greater than or equal to 2, and wherein each sub-matrix has a size equal to n1*n1, or n2*n2, respectively.

8. Method of decoding according to claim 1, wherein the number of symbols processed in each group of symbols is equal to min (n1, n2).

9. Method of decoding according to claim 1, wherein at least one of processed data is weighted.

10. Method of decoding according to claim 1, wherein said method of decoding does not comprise a step of data memorisation according to a memory plane between the first decoding and the second decoding.

11. Method of decoding according to claim 1, wherein the first decoding and the second decoding are successively implemented by same decoders, and wherein the method comprises a step of memorization of the data between the first decoding and the second decoding.

12. Method of decoding according to claim 1, wherein said method is iterative.

13. Module for decoding arranged for implementing a method of decoding a matrix constructed from concatenated codes, corresponding to at least two elementary codes, with uniform interleaving, the matrix having n1 lines, n2 columns and n1*n2 symbols, wherein the method comprises, processing all the lines- and columns-vectors of the matrix by groups of symbol groups, the processing comprising a first decoding to simultaneously process all the symbols of a group of symbols according to their lines and then a second decoding to simultaneously process all the symbols of said group of symbols according to their columns, the symbol groups being thus successively processed according to their lines and their columns, or conversely a first decoding to simultaneously process all the symbols of a group of symbols according to their columns and then a second decoding to simultaneously process all the symbols of said group of symbols according to their lines, the symbol groups being thus successively processed according to their columns and their lines, said module comprising a line-decoder assembly arranged for decoding the lines of said matrix and a column-decoder assembly arranged for decoding the columns of said matrix, wherein the line-decoder assembly and the column-decoder assembly are arranged so as to process all the lines- and columns-vectors of the matrix by successive symbol groups, said first and second decodings being provided by the line-decoding assembly and the column-decoding assembly, respectively, or conversely said first and second decodings being provided by the column-decoding assembly and the line-decoding assembly, respectively.

14. Decoding module according to 13, wherein the module does not comprise memory between the line-decoder assembly and the column-decoder assembly, except memories possibly integrated into the line- or column-decoder assemblies.

15. Decoding module according to claim 13, wherein the line-decoding assembly or column-decoding assembly comprises n1 or respectively n2 parallel elementary decoders and wherein the column-decoding assembly or respectively line-decoding assembly is constituted of a combinatory decoder arranged for simultaneously processing n1 or respectively n2 symbols.

16. Decoding module according to claim 13, wherein the line-decoding assembly comprises n parallel lines-decodes that is equal to the number of parallel columns-decoders comprised in the column-decoding assembly, n being strictly below n1*n2.

17. Decoding module according to claim 16, wherein n is below or equal to min (n1, n2).

18. Decoding module according to claim 16, wherein each one of the line-decoding assembly and the column-decoding assembly comprises at least one decoder arranged for simultaneously treating at least two different symbols.

19. Decoding module according to claim 16, wherein the line-decoding assembly and the column-decoding assembly comprise parallel line-decoders and parallel column-decoders, respectively, and are arranged such that the line-decoders are electrically connected to the column-decoders via a dynamic interconnection network.

20. Decoding module according to claim 19, wherein the dynamic interconnection network allows a profile of communication between the line-decoders and the column-decoders of the type of circular permutation, a circular permutation cyclically modifying the connections between line-decoders and column-decoders thus determining successive processing of the symbol groups in the matrix.

21. Decoding module according to claim 20, wherein the dynamic interconnection network is chosen among multi-stages, Crossbar, point-to-point networks.

22. Decoding module according to claim 19, further comprising a second dynamic interconnection network which is substantially identical to the first dynamic interconnection network, the second dynamic interconnection network being located at the output or at the input of the column-decoder assembly or at the input or at the output of the line-decoder assembly.

23. Decoding module according to claim 13, further comprising an input-memory for temporarily memorizing the matrix, the line-decoder assembly or the column-decoder assembly being connected to the input-memory so as to be fed by the lines or by the columns, respectively, of the memorized matrix.

24. Device of modular decoding comprising a plurality of decoding modules which are series connected, each one of these modules being according to claim 22, the first and second dynamic interconnection networks of the decoding modules being configured to implement an iterative decoding of the matrix, each iteration being provided by a decoding module.

25. Modular decoding device comprising a plurality of decoding modules which are series connected, each one of these modules being according to claim 15.

26. Sequential decoding device comprising a decoding module according to claim 23, comprising an electrical link between the output of the decoding module and the input of the decoding module so as to implement an iterative decoding of the matrix, every iterations being provided by the decoding module.

27. Reception terminal comprising means for receiving signals that carry useful data and means for processing these signals, characterized in that said processing means comprises a decoding module according to claim 13.

28. Reception terminal according to claim 27, wherein the reception terminal is selected from the group consisting of a fixed or a laptop computer, a mobile phone, a smart-phone, a fixed base station, a PDA, and an Internet access point.

29. Method for coding a matrix having k1 lines, k2 columns and k1*k2 useful data ordered in lines- and columns-vectors, comprising k2 or k1 elementary codings according to the lines or according to the columns, respectively, wherein the method further comprises a combinatory coding able to simultaneously process k2 or k1, respectively, useful data according to the columns or lines, respectively, and wherein the method comprises:

a first step of coding of a column-vector or line-vector, respectively, which processes said k2 or k1, respectively elementary codings, by k2 or k1, respectively, elementary coders able to process one useful data item at a time, a second step of coding said column-vector or line-vector, respectively, processing said combinatory coding, by a coder assembly able to simultaneously process all the k2 useful data of a line-vector or all the k1 useful data of a column-vector, respectively, wherein the second step of coding said column-vector or line-vector, respectively, is performed after the first step of coding said column-vector or line-vector, respectively, and simultaneously with a first step of coding another column-vector or line-vector, respectively.

30. Module for coding a matrix having k1 lines, k2 columns and k1*k2 useful data ordered in line-vectors and in column-vectors, the module comprising k2 or k1 elementary coders able to process one useful data item at a time, wherein the module further comprises a coder assembly able to simultaneously process all the k2 useful data of a line-vector or all the k1 useful data of a column-vector, respectively, and arranged with the k2 or k1, respectively, elementary coders such that the useful data vectors having a k2 dimension or k1 dimension, respectively, are successively coded, each coding of vector comprising a first coding processed by the k2 or k1, respectively, elementary coders and then a second coding processed by the coder assembly.

31. Coding module according to claim 30, wherein it does not comprise intermediary memory between the k2 or k1, respectively, elementary coders and the coder assembly, except memories possibly integrated into the elementary coders or into the coder assembly.

32. Coding module according to claim 31, wherein the assembly coder corresponds to a combinatory tree structure of exclusive-OR functions.

33. Emission terminal comprising means for emitting signals which carry useful data and means for processing the useful data, wherein said processing means comprises a coding module according to claim 30.

34. Emission terminal according to claim 33, wherein the emission terminal is selected from the group consisting of a fixed or laptop computer, a mobile phone, a Smart-phone, a fixed base station, a PDA, and an Internet access point.

\* \* \* \* \*

UNITED STATES PATENT AND TRADEMARK OFFICE
CERTIFICATE OF CORRECTION

PATENT NO. : 8,332,716 B2  
APPLICATION NO. : 11/994803  
DATED : December 11, 2012  
INVENTOR(S) : Jego et al.

Page 1 of 1

It is certified that error appears in the above-identified patent and that said Letters Patent is hereby corrected as shown below:

In the Specifications:

<u>Column 5</u>
Line 6, delete "is"

Signed and Sealed this
Seventh Day of May, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,332,716 B2  
APPLICATION NO. : 11/994803  
DATED : December 11, 2012  
INVENTOR(S) : Jego et al.

Page 1 of 1

It is certified that error appears in the above-identified patent and that said Letters Patent is hereby corrected as shown below:

Title Page

"(73) Assignee: Groupe des Ecoles des Telecommunications (Enst Bretagne), Paris (FR)" should read --(73) Assignees: Groupe des Ecoles des Telecommunications (Enst Bretagne), Paris (FR); France Telecom, Paris (FR)--

Signed and Sealed this  
Thirteenth Day of August, 2013

Teresa Stanek Rea  
*Acting Director of the United States Patent and Trademark Office*